(12) United States Patent
Jang et al.

(10) Patent No.: US 12,183,768 B2
(45) Date of Patent: Dec. 31, 2024

(54) DISPLAY DEVICE AND TILED DISPLAY INCLUDING THE SAME

(71) Applicant: Samsung Display Co., LTD., Yongin-si (KR)

(72) Inventors: Dae Hwan Jang, Seoul (KR); Woo Yong Sung, Seoul (KR); Jin Ho Cho, Cheonan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 492 days.

(21) Appl. No.: 17/347,046

(22) Filed: Jun. 14, 2021

(65) Prior Publication Data
US 2021/0408109 A1    Dec. 30, 2021

(30) Foreign Application Priority Data

Jun. 25, 2020   (KR) .......................... 10-2020-0078074

(51) Int. Cl.
| | | |
|---|---|---|
| H01L 27/15 | (2006.01) | |
| H01L 23/498 | (2006.01) | |
| H01L 33/50 | (2010.01) | |
| H01L 33/52 | (2010.01) | |
| H01L 33/62 | (2010.01) | |

(52) U.S. Cl.
CPC ........ H01L 27/156 (2013.01); H01L 23/4985 (2013.01); H01L 33/50 (2013.01); H01L 33/52 (2013.01); H01L 33/62 (2013.01)

(58) Field of Classification Search
CPC ... H01L 27/156; H01L 23/4985; H01L 33/50; H01L 33/52; H01L 33/62; H01L 33/44; H01L 33/58; H01L 25/167; H01L 25/0753; H10K 59/18; H10K 59/873
See application file for complete search history.

(56) References Cited

U.S. PATENT DOCUMENTS

| | | | | |
|---|---|---|---|---|
| 2013/0270546 A1* | 10/2013 | Chang | ............... | H01L 29/66969 438/151 |
| 2018/0081399 A1* | 3/2018 | Kwon | ....................... | G09G 5/00 |
| 2019/0150297 A1* | 5/2019 | Kim | ........................ | G09F 9/301 345/30 |
| 2020/0257027 A1* | 8/2020 | Takiguchi | ......... | H01L 27/14627 |
| 2021/0202675 A1* | 7/2021 | Jang | ..................... | H10K 59/122 |
| 2022/0384492 A1* | 12/2022 | Lu | .......................... | H01L 27/15 |

FOREIGN PATENT DOCUMENTS

| | | |
|---|---|---|
| KR | 10-2006-0001698 | 1/2006 |
| KR | 10-2018-0003684 | 1/2018 |
| KR | 10-2018-0079080 | 7/2018 |

\* cited by examiner

*Primary Examiner* — Ratisha Mehta
(74) *Attorney, Agent, or Firm* — KILE PARK REED & HOUTTEMAN PLLC

(57) ABSTRACT

A display device includes a substrate comprising a display part, a pad part, and a bending part between the display part and the pad part, a display layer disposed on a first surface of the display part and comprising pixels, a pad electrode disposed on a first surface of the pad part, and a metal layer disposed on a second surface of the display part and on a second surface of the pad part. The second surface of the display part is opposite to the first surface of the display part, and the second surface of the pad part is opposite to the first surface of the pad part. A thickness of the bending part is smaller than at least one of a thickness of the display part and a thickness of the pad part. A planar shape of the bending part is determined by the metal layer.

10 Claims, 12 Drawing Sheets

LA: LA1, LA2, LA3
BA: BA1, BA2, BA3

DISPLAY DEVICE AND TILED DISPLAY INCLUDING THE SAME

CROSS-REFERENCE TO RELATED APPLICATION(S)

This application claims priority to and benefits of Korean Patent Application No. 10-2020-0078074 under 35 U.S.C. § 119, filed on Jun. 25, 2020 in the Korean Intellectual Property Office, the entire contents of which are incorporated herein by reference.

BACKGROUND

1. Technical Field

The disclosure relates to a display device and a tiled display having the same.

2. Description of the Related Art

As information-oriented society evolves, various demands for display devices are ever increasing. For example, display devices are being employed by a variety of electronic devices such as smart phones, digital cameras, laptop computers, navigation devices, and smart televisions. Display devices may be flat panel display devices such as a liquid-crystal display device, a field emission display device, or an organic light-emitting display device. Among such flat panel display devices, a light-emitting display device includes a light-emitting element that can emit light on its own, so that each of the pixels of the display panel can emit light by themselves. Accordingly, a light-emitting display device can display images without the need for a backlight unit that supplies light to the display panel.

For a display device having a large screen, a large amount of pixels may be disposed, and thus the defect rate of light-emitting elements may increase while productivity or reliability may decrease. To overcome such issues, a tiled display can provide a large screen by connecting multiple display devices having a relatively small size. Such a tiled display may include boundaries between the multiple display devices, which may be referred to as seams. The seams may be non-display areas or bezel areas between the multiple display devices adjacent to each other. In case that a single image may be displayed on the full screen (e.g., large screen tiled display), such boundaries or seams between individual display devices may be visible thereby hindering a viewer from getting immersed into the image.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

An aspect of the disclosure may provide a tiled display that eliminates visible seams between multiple display devices by way of preventing the boundaries or non-display areas between the display devices from being recognized so that a viewer can be immersed into displayed images.

It should be noted that aspects of the disclosure are not limited to the above-mentioned aspect. Other aspects of the invention will be apparent to those skilled in the art from the following descriptions.

According to an embodiment of the disclosure, a display device may include a substrate comprising a display part, a pad part, and a bending part between the display part and the pad part, a display layer disposed on a first surface of the display part, the display layer comprising pixels, a pad electrode disposed on a first surface of the pad part, and a metal layer disposed on a second surface of the display part and on a second surface of the pad part. The second surface of the display part may be opposite to the first surface of the display part, and the second surface of the pad part may be opposite to the first surface of the pad part. A thickness of the bending part may be smaller than at least one of a thickness of the display part and a thickness of the pad part, and a planar shape of the bending part may be determined by the metal layer.

The metal layer may comprise a metal oxide that may be resistant to dry etching. An etch rate of the metal layer may be lower than an etch rate of the substrate.

A thermal conductivity of the metal layer may be higher than a thermal conductivity of the substrate.

The pad part may overlap the display part in a thickness direction in case that the bending part may be bent.

The display device may further comprise a protective film covering the metal layer disposed on the second surface of the display part and the metal layer disposed on the second surface of the pad part.

A part of the protective film covering the metal layer disposed on the second surface of the display part and another part of the protective film covering the metal layer disposed on the second surface of the pad part may face each other in case that the bending part may be bent.

The display device may further include a flexible film electrically connected to the pad electrode, and a source driver disposed on the flexible film. The flexible film and the source driver may overlap the display part in a thickness direction in case that the bending part may be bent.

The display layer may include a thin-film transistor layer disposed on the display part and comprising at least one thin-film transistor, a light emitting element layer disposed on the thin-film transistor layer and comprising a light-emitting element electrically connected to the at least one thin-film transistor, a wavelength conversion layer disposed on the light emitting element layer and comprising a wavelength converting unit overlapping the light-emitting element, and a color filter layer disposed on the wavelength conversion layer and comprising a color filter overlapping the wavelength converting unit.

According to an embodiment of the disclosure, a tiled display may include display devices each comprising a substrate comprising a display part, a pad part and a bending part between the display part and the pad part, a coupling member for coupling the display devices with one another, and a cover member covering the display devices and the coupling member. Each of the display devices may comprise a display layer disposed on a first surface of the display part, the display layer comprising pixels, a pad electrode disposed on a first surface of the pad part, and a metal layer disposed on a second surface of the display part and on a second surface of the pad part. The second surface of the display part may be opposite to the first surface of the display part, and the second surface of the pad part may be opposite to the first surface of the pad part. A thickness of the bending part may be smaller than at least one of a thickness of the display part and a thickness of the pad part, and a planar shape of the bending part may be determined by the metal layer.

The metal layer may comprise a metal oxide that may be resistant to dry etching. An etch rate of the metal layer may be lower than that of the substrate.

A thermal conductivity of the metal layer may be higher than a thermal conductivity of the substrate.

The bending part of each of the display devices may overlap the coupling member in a thickness direction.

The bending part of each of the display devices may be disposed between the display parts of adjacent ones of the display devices.

Each of the display devices may further comprise a flexible film electrically connected to the pad electrode, and a source driver disposed on the flexible film. The flexible film and the source driver may overlap the display part in a thickness direction.

The pad part may overlap the display part in a thickness direction.

Each of the display devices may further comprise a protective film covering the metal layer disposed on the second surface of the display part and the metal layer disposed on the second surface of the pad part.

A part of the protective film covering the metal layer disposed on the second surface of the display part and another part of the protective film covering the metal layer disposed on the second surface of the pad part may face each other.

The display layer may include a thin-film transistor layer disposed on the display part and comprising at least one thin-film transistor, a light emitting element layer disposed on the thin-film transistor layer and comprising a light-emitting element electrically connected to the at least one thin-film transistor, a wavelength conversion layer disposed on the light emitting element layer and comprising a wavelength converting unit overlapping the light-emitting element, and a color filter layer disposed on the wavelength conversion layer and comprising a color filter overlapping the wavelength converting unit.

Each of the display devices may further comprise an encapsulation layer covering an upper surface and side surfaces of the display layer. The coupling member may be disposed between encapsulation layers of adjacent ones of the display devices.

The cover member may cover the encapsulation layer of each of the display devices.

According to an embodiment of the disclosure, each of the display devices of a tiled display may include a bending part having a smaller thickness than that of a display part or a pad part, so that bending stress at the bending part can be reduced. Each of the display devices may include the bending part that may be depressed from the display part or the pad part, thereby reducing the distance between the display devices. As a result, it may be possible to prevent the non-display areas or the boundaries between the display devices from being perceived.

According to an embodiment of the disclosure, each of the display devices of a tiled display may include a metal layer, and thus it may be possible to form the bending part without using a separate mask, so that the processing steps and the process time can be reduced. Each of the display devices may include no separate heat dissipation layer, so that the thickness of the display devices can be reduced and the fabricating cost can be saved. Since each of the display devices may include the metal layer, the thickness of the display devices can be reduced compared to a display device including a separate heat dissipation layer, thereby preventing layer separation in case that the bending part BP may be bent.

It should be noted that effects of the disclosure are not limited to those described above and other effects of the disclosure will be apparent to those skilled in the art from the following description.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
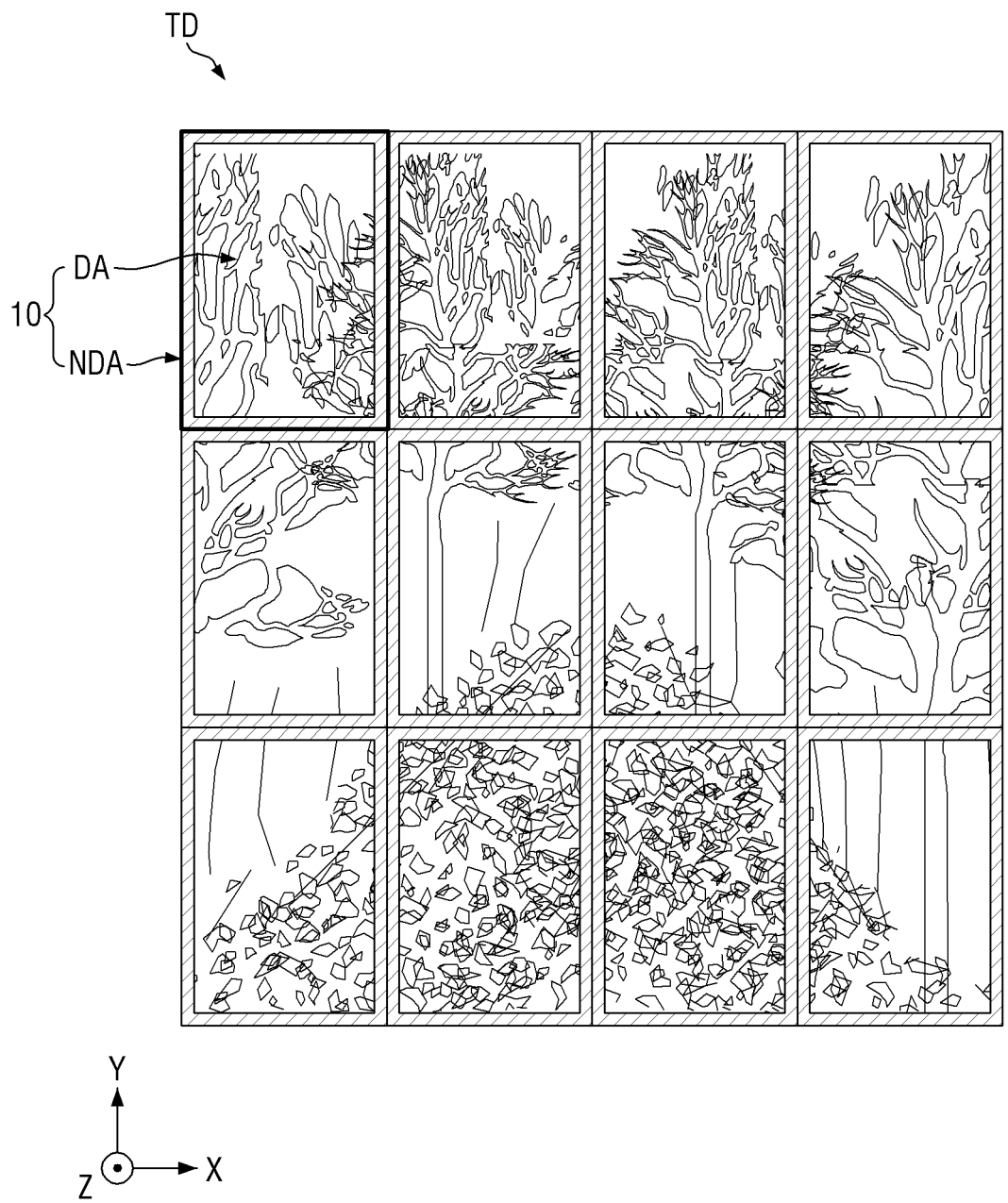
FIG. 1 is a schematic plan view showing a tiled display according to an embodiment of the disclosure.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to another element or intervening elements may be present. When, however, an element is referred to as being "directly on," "directly connected to," or "directly coupled to" another element, there may be no intervening elements present. To this end, the term "connected" may refer to physical, electrical, and/or fluid connection, with or without intervening elements. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another, or may represent different directions that may not be perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items. Further, the terms "and" and "or" may be used in the conjunctive or disjunctive, and should generally be interpreted as "and/or".

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one element's relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein should be interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the scope of the inventive concepts. Further, the blocks, units, and/or modules of some embodiments may be physically combined into more complex blocks, units, and/or modules without departing from the scope of the inventive concepts.

The term "overlap" may include layer, stack, face or facing, extending over, extending under, covering or partly covering or any other suitable term as would be appreciated and understood by those of ordinary skill in the art.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a schematic plan view showing a tiled display according to an embodiment of the disclosure.

Referring to FIG. 1, a tiled display TD may include multiple display devices 10. The multiple display devices 10 may be arranged in, but are not limited to, a lattice pattern. The multiple display devices 10 may be extended in a first direction (X-axis direction) or a second direction (Y-axis direction), and the tiled display TD may have a certain shape. The multiple display devices 10 may all have the same size. It is, however, to be understood that the disclosure is not limited thereto. For example, the multiple display devices 10 may have different sizes.

Each of the multiple display devices 10 may have a rectangular shape including longer sides and shorter sides. The display devices 10 may be arranged such that the longer sides or the shorter sides of the display devices 10 may be extended from one another. Some of the display devices 10 may be disposed on an edge of the tiled display TD to form one side of the tiled display TD. Some others of the display devices 10 may be disposed at a corner of the tiled display TD, and may form two adjacent sides of the tiled display TD. Still some others of the display devices 10 may be disposed on the inner side of the tiled display TD and may be surrounded by the other display devices 10.

Each of the display devices 10 may include a display area DA and a non-display area NDA. The display area DA may include pixels to display images. The non-display area NDA may be disposed adjacent to (e.g., around) the display area DA, and in embodiments, may surround the display area DA, and may not display an image.

The tiled display TD may have, but is not limited to, a generally planar shape. The tiled display TD may have a three-dimensional shape, giving a viewer a three-dimensional experience. For example, in case that the tiled display TD has a three-dimensional shape, at least some of the display devices 10 may have a curved shape. As another example, the display devices 10 may have a flat shape and may be extended from one another at an angle, so that the tiled display TD may have a three-dimensional shape.

The tiled display TD may be formed by connecting non-display areas NDA of the adjacent display devices 10 with one another. The multiple display devices 10 may be extended from one another through a bonding member or an adhesive member. Accordingly, the non-display area NDA between the display devices 10 may be surrounded by adjacent display areas DA. The display areas DA of the display devices 10 may be so close to one another that a viewer may not recognize the non-display areas NDA between the display devices 10 or the boundaries between the display devices 10. The reflectivity of external light at the display areas DA of the multiple display devices 10 may be substantially equal to the reflectivity of external light at the non-display areas NDA between the display devices 10. Accordingly, the tiled display TD can allow a viewer to get immersed into the images by eliminating seams between the display devices 10 by way of preventing the non-display areas NDA or the boundaries between the multiple display devices 10 from being perceived.

Figure 2:
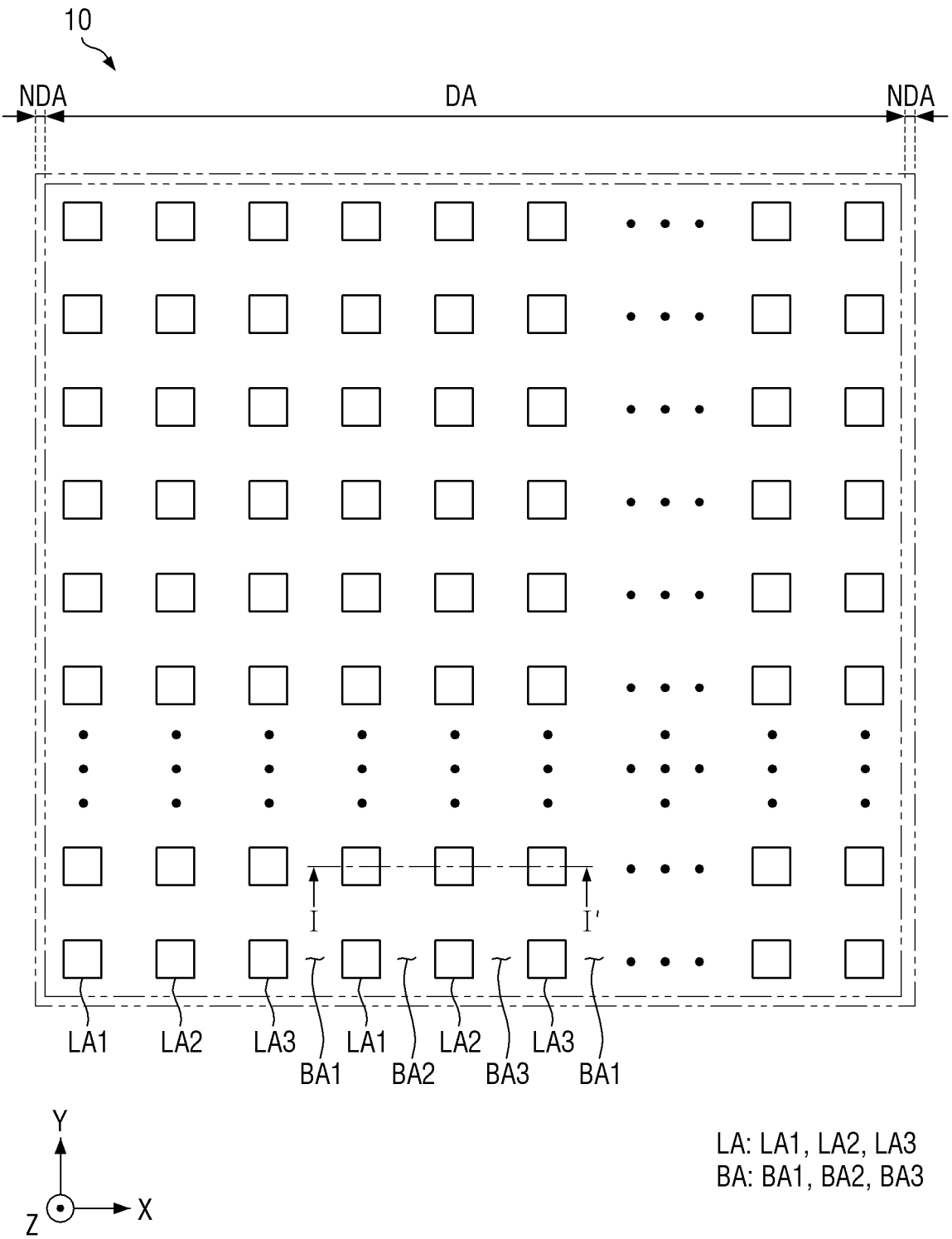
FIG. 2 is a schematic plan view showing a display device according to an embodiment of the disclosure.

FIG. 2 is a schematic plan view showing a display device according to an embodiment of the disclosure.

Referring to FIG. 2, the display device 10 may include pixels arranged of rows and columns in the display area DA. Each of the pixels may include a light-emitting area LA defined by a pixel defining layer, and may emit light having a peak wavelength through the light-emitting area LA. For example, the display area DA of each of the display devices 10 may include first to third light-emitting areas LA1, LA2, and LA3. In each of the first to third light-emitting areas LA1, LA2 and LA3, light generated by a light-emitting element of the display device 10 may exit out of the display device 10.

The first to third light-emitting areas LA1, LA2, and LA3 may emit light having a peak wavelength to the outside of the display device 10. The first light-emitting area LA1 may emit light of a first color, the second light-emitting area LA2 may emit light of a second color, and the third light-emitting area LA3 may emit light of a third color. For example, the light of the first color may be red light having a peak wavelength in the range of about 610 to about 650 nm, the light of the second color may be green light having a peak wavelength in the range of about 510 to about 550 nm, and the light of the third color may be blue light having a peak wavelength in the range of about 440 to about 480 nm. It is, however, to be understood that the disclosure is not limited thereto.

The first to third light-emitting areas LA1, LA2, and LA3 may be arranged repeatedly and sequentially along the first direction (X-axis direction) of the display area DA. For example, the width of the first light-emitting area LA1 in the first direction (X-axis direction) may be larger than the width of the second light-emitting region LA2 in the first direction. The width of the second light-emitting area LA2 in the first direction may be larger than the width of the third light-emitting area LA3 in the first direction. As another example, the width of the first light-emitting area LA1 in the first direction (X-axis direction), the width of the second light-emitting area LA2 in the first direction, and the width of the third light-emitting area LA3 in the first direction may be substantially equal.

In an embodiment, the area of the first light-emitting area LA1 may be larger than the area of the second light-emitting area LA2, and the area of the second light-emitting area LA2 may be larger than the area of the third light-emitting area LA3. As another example, the area of the first light-emitting area LA1, the area of the second light-emitting area LA2 and the area of the third light-emitting area LA3 may be substantially equal.

The display area DA of the display device 10 may include light-blocking areas BA surrounding the light-emitting areas LA. For example, the display area DA may include first to third light-blocking areas BA1, BA2, and BA3. The first to third light-blocking areas BA1, BA2 and BA3 may be disposed adjacent to (e.g., on a side of) the first to third light-emitting areas LA1, LA2 and LA3, respectively, thereby preventing mixture of the lights emitted from the first to third light-emitting areas LA1, LA2 and LA3.

Figure 3:
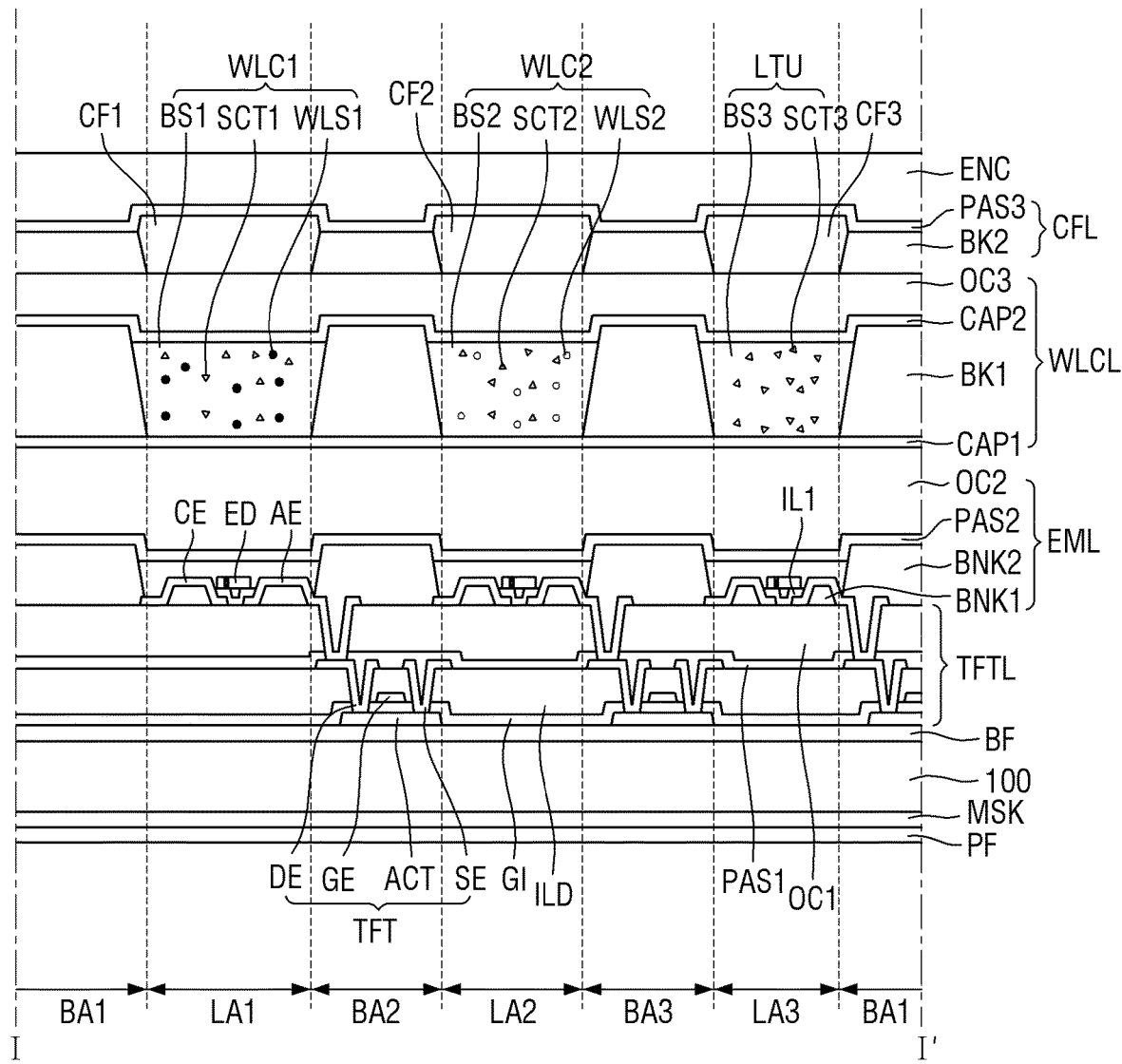
FIG. 3 is a schematic cross-sectional view, taken along line I-I' of FIG. 2.

FIG. 3 is a schematic cross-sectional view, taken along line I-I' of FIG. 2.

Referring to FIG. 3, the display area DA of each of the display devices 10 may include first to third light-emitting areas LA1, LA2, and LA3. In each of the first to third light-emitting areas LA1, LA2 and LA3, light generated by light-emitting diodes ED of the display device 10 may exit out of the display device 10.

The display device 10 may include a substrate 100, a buffer layer BF, a display layer DPL, and an encapsulation layer ENC.

The substrate 100 may be a base substrate or a base member and may be made of an insulating material such as a polymer resin. For example, the substrate 100 may be a flexible substrate that can be bent, folded, or rolled. The substrate 100 may include, but is not limited to, polyimide (PI).

The buffer layer BF may be disposed on the substrate 100. The buffer layer BF may be formed of an inorganic film that can prevent the permeation of air or moisture. For example, the buffer layer BF may include multiple inorganic films stacked on one another alternately.

The display layer DPL may include a thin-film transistor layer TFTL, a light emitting element layer EML, a wavelength conversion layer WLCL, and a color filter layer CFL.

The thin-film transistor layer TFTL may include a thin-film transistor TFT, a gate insulator GI, an interlayer dielectric layer ILD, a first passivation layer PAS1, and a first planarization layer OC1.

The thin-film transistor TFT may be disposed on the buffer layer BF, and may form a pixel circuit of each of multiple pixels. For example, the thin-film transistor TFT may be a driving transistor or a switching transistor of the pixel circuit. The thin-film transistor TFT may include a semiconductor layer ACT, a gate electrode GE, a source electrode SE, and a drain electrode DE.

The semiconductor layer ACT may be disposed on the buffer layer BF. The semiconductor layer ACT may overlap the gate electrode GE, the source electrode SE and the drain electrode DE. The semiconductor layer ACT may be in direct contact with the source electrode SE and the drain electrode DE, and may face the gate electrode GE with the gate insulator GI therebetween.

The gate electrode GE may be disposed on the gate insulator GI. The gate electrode GE may overlap the semiconductor layer ACT with the gate insulator GI interposed therebetween.

The source electrode SE and the drain electrode DE may be disposed on the interlayer dielectric layer ILD such that they may be spaced apart from each other. The source electrode SE may be in contact with an end of the semiconductor layer ACT through a contact hole formed in the gate insulator GI and the interlayer dielectric layer ILD. The drain electrode DE may be in contact with another end of the semiconductor layer ACT through a contact hole formed in the gate insulator GI and the interlayer dielectric layer ILD. The drain electrode DE may be electrically connected to a first electrode AE of a light-emitting element EL through a contact hole formed in the first passivation layer PAS1 and the first planarization layer OC1.

The gate insulator GI may be disposed on the semiconductor layer ACT. For example, the gate insulator GI may be disposed on the semiconductor layer ACT and the buffer layer BF, and may insulate the semiconductor layer ACT from the gate electrode GE. The gate insulator GI may include a contact hole penetrating through the source electrode SE and a contact hole penetrating through the drain electrode DE.

The interlayer dielectric layer ILD may be disposed over the gate electrode GE. For example, the interlayer dielectric layer ILD may include the contact hole via which the source electrode SE penetrates, and the contact hole via which the drain electrode DE penetrates. The contact hole of the interlayer dielectric layer ILD may be electrically connected to the contact hole of the gate insulator GI.

The first passivation layer PAS1 may be disposed above the thin-film transistor TFT to protect the thin-film transistor TFT. For example, the first passivation layer PAS1 may include a contact hole through which the first electrode AE passes.

The first planarization layer OC1 may be disposed on the first passivation layer PAS1 to provide a flat surface over the thin-film transistor TFT. For example, the first planarization layer OC1 may include a contact hole through which the first electrode AE of the light-emitting element EL passes. The contact hole in the first planarization layer OC1 may be electrically connected to the contact hole in the first passivation layer PAS1.

The light emitting element layer EML may include a light-emitting element EL, a first bank BNK1, a second bank BNK2, a second passivation layer PAS2, and a second planarization layer OC2.

The light-emitting element EL may be disposed on the thin-film transistor TFT. The light-emitting element EL may include a first electrode AE, a second electrode CE, and a light-emitting diode ED.

The first electrode AE may be disposed on the first planarization layer OC1. For example, the first electrode AE may be disposed on the first bank BNK1 disposed on the first planarization layer OC1 to cover the first bank BNK1. The first electrode AE may be disposed to overlap one of the first to third light-emitting areas LA1, LA2 and LA3 defined by the second bank BNK2. The first electrode AE may be electrically connected to the drain electrode DE of the thin-film transistor TFT. The first electrode AE may be, but is not limited to, an anode electrode of the light-emitting diode ED.

The second electrode CE may be disposed on the first planarization layer OC1. For example, the second electrode CE may be disposed on the first bank BNK1 disposed on the first planarization layer OC1 to cover the first bank BNK1. The second electrode CE may be disposed to overlap one of the first to third light-emitting areas LA1, LA2 and LA3 defined by the second bank BNK2. For example, the second electrode CE may receive a common voltage applied to all pixels. The second electrode CE may be, but is not limited to, a cathode electrode of the light-emitting diode ED.

The first insulating layer IL1 may cover a part of the first electrode AE and a part of the second electrode CE adjacent to each other and may insulate the first and second electrodes AE and CE from each other.

The light-emitting diode ED may be disposed between the first electrode AE and the second electrode CE above the first planarization layer OC1. The light-emitting diode ED may be disposed on the first insulating layer ILL An end of the light-emitting diode ED may be electrically connected to the first electrode AE, and another end of the light-emitting diode ED may be electrically connected to the second electrode CE. For example, the light-emitting diodes ED may include active layers having the same material so that they may emit light of the same wavelength or light of the same color. The light emitted from each of the first to third light-emitting areas LA1, LA2 and LA3 may have the same color. For example, the light-emitting diodes ED may emit light of the third color or blue light having a peak wavelength in the range of about 440 nm to about 480 nm. Therefore, the light emitting element layer EML may emit light of the third color or blue light.

The second bank BNK2 may be disposed on the first planarization layer OC1 to define first to third light-emitting areas LA1, LA2, and LA3. For example, the second bank BNK2 may surround each of the first to third light-emitting areas LA1, LA2 and LA3. It is, however, to be understood that the disclosure is not limited thereto. The second bank BNK2 may separate and insulate the first electrode AE or the second electrode CE of a light-emitting element EL from that of another light-emitting element EL. The second bank BNK2 may be disposed in the first to third light-blocking areas BA1, BA2, and BA3.

The second passivation layer PAS2 may be disposed on the light-emitting elements EL and the second bank BNK2. The second passivation layer PAS2 may cover the light-emitting elements EL to protect the light-emitting elements EL. The second passivation layer PAS2 can prevent permeation of impurities such as moisture and air from outside to prevent damage to the light-emitting elements EL.

The second planarization layer OC2 may be disposed on the second passivation layer PAS2 to provide a flat surface over the light emitting element layer EML. The second planarization layer OC2 may include an organic material. For example, the second planarization layer OC2 may be at least one of an acrylic resin, an epoxy resin, a phenol resin, a polyamide resin, and a polyimide resin.

The wavelength conversion layer WLCL may include a first capping layer CAP1, a first light-blocking member BK1, a first wavelength-converting unit WLC1, a second wavelength-converting unit WLC2, a light-transmitting unit LTU, a second cap layer CAP2, and a third planarization layer OC3.

The first capping layer CAP1 may be disposed on the second planarization layer OC2 of the light emitting element layer EML. The first capping layer CAP1 may seal the lower surfaces of the first and second wavelength converting units WLC1 and WLC2 and the light-transmitting unit LTU. The first capping layer CAP1 may include an inorganic material. For example, the first capping layer CAP1 may include at least one of silicon nitride, aluminum nitride, zirconium nitride, titanium nitride, hafnium nitride, tantalum nitride, silicon oxide, aluminum oxide, titanium oxide, tin oxide, cerium oxide and silicon oxynitride.

The first light-blocking member BK1 may be disposed in the first to third light-blocking areas BA1, BA2 and BA3 on the first capping layer CAP1. The first light-blocking member BK1 may overlap the second bank BNK2 in the thickness direction. The first light-blocking member BK1 can block the transmission of light. The first light-blocking member BK1 can improve the color gamut by preventing lights from intruding and mixing among the first to third light-emitting areas LA1, LA2 and LA3. The first light-blocking member BK1 may be arranged in a lattice shape surrounding the first to third light-emitting regions LA1, LA2, and LA3 when viewed from the top.

The first light-blocking member BK1 may include an organic light-blocking material, a liquid repellent component, or a combination thereof. Herein, the liquid repellent component may be composed of a fluorine-containing monomer or a fluorine-containing polymer, and specifically, may include a fluorine-containing aliphatic polycarbonate. For example, the first light-blocking member BK1 may be made of a black organic material including the liquid repellent component. The first light-blocking member BK1 may be formed via coating and exposure processes for an organic light-blocking material containing a liquid repellent component, etc.

Since the first light-blocking member BK1 may include the liquid repellent component, the first and second wavelength converting units WLC1 and WLC2 and the light-transmitting unit LTU may be separated so that they can correspond to the respective light-emitting areas LA. For example, in case that the first and second wavelength conversion units WLC1 and WLC2 and the light-transmitting unit LTU are formed by an inkjet method, an ink composition may flow on the upper surface of the first light-blocking member BK1. In this regard, the first light-blocking member BK1 may include the liquid-repellent component, and thus it is possible to guide the ink composition to flow to the light-emitting areas. Therefore, the first light-blocking member BK1 can prevent the ink composition from mixing.

The first wavelength-converting unit WLC1 may be disposed in the first light-emitting area LA1 on the first capping layer CAP1. The first wavelength-converting unit WLC1 may be surrounded by the first light-blocking member BK1. The first wavelength-converting unit WLC1 may include a first base resin BS1, first scatterers SCT1, and first wavelength shifters WLS1.

The first base resin BS1 may include a material having a relatively high light transmittance. The first base resin BS1 may be made of a transparent organic material. For example, the first base resin BS1 may include at least one organic material among an epoxy resin, an acrylic resin, a cardo resin, and an imide resin.

The first scatterers SCT1 may have a refractive index different from that of the first base resin BS1 and may form an optical interface with the first base resin BS1. For example, the first scatterers SCT1 may include a light scattering material or light scattering particles that scatter at least a part of transmitted light. For example, the first scatterers SCT1 may include a metal oxide such as titanium oxide ($TiO_2$), zirconium oxide ($ZrO_2$), aluminum oxide ($Al_2O_3$), indium oxide ($In_2O_3$), zinc oxide (ZnO), tin oxide ($SnO_2$), or a combination thereof, or may include organic particles such as an acrylic resin, a urethane resin, or a combination thereof. The first scatterers SCT1 may scatter light in random directions irrespective of the incidence direction of the incident light, without substantially changing the peak wavelength of the incident light.

The first wavelength shifters WLS1 may convert or shift the peak wavelength of the incident light to a first peak wavelength. For example, the first wavelength shifters WLS1 may convert blue light provided from the display device 10 into red light having a single peak wavelength in the range of about 610 nm to about 650 nm, and output the light. The first wavelength shifters WLS1 may be quantum dots, quantum rods, phosphor, or a combination thereof. The quantum dots may be particulate matter that emits a color as electrons transition from the conduction band to the valence band.

For example, the quantum dots may be semiconductor nanocrystalline material. The quantum dots may have a specific band gap depending on their compositions and size, and can absorb light and emit light having an intrinsic wavelength. Examples of the semiconductor nanocrystals of the quantum dots may include Group IV nanocrystals, Groups II-VI compound nanocrystals, Groups III-V compound nanocrystals, Groups IV-VI nanocrystals, or combinations thereof.

The group II-VI compounds may be selected from the group consisting of binary compounds selected from the group consisting of CdSe, CdTe, ZnS, ZnSe, ZnTe, ZnO, HgS, HgSe, HgTe, MgSe, MgS and a mixture thereof; ternary compounds selected from the group consisting of InZnP, AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS and a mixture thereof; and quaternary compounds selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe and a mixture thereof.

The group III-V compounds may be selected from the group consisting of binary compounds selected from the group consisting of GaN, GaP, GaAs, GaSb, AlN, AlP, AlAs, AlSb, InN, InP, InAs, InSb and a mixture thereof; ternary compounds selected from the group consisting of GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, GaAlNP and a mixture thereof; and quaternary compounds selected from the group consisting of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb and a mixture thereof.

The group IV-VI compounds may be selected from the group consisting of binary compounds selected from the group consisting of SnS, SnSe, SnTe, PbS, PbSe, PbTe and a mixture thereof; ternary compounds selected from the group consisting of SnSeS, SnSeTe, SnSTe, PbSeS, PbSeTe, PbSTe, SnPbS, SnPbSe, SnPbTe and a mixture thereof; and quaternary compounds selected from the group consisting of SnPbSSe, SnPbSeTe, SnPbSTe and a mixture thereof. The group IV elements may be selected from the group consisting of Si, Ge and a mixture thereof. The group IV compounds may be binary compounds selected from the group consisting of SiC, SiGe and a mixture thereof.

For example, the above-described binary compounds, ternary compounds or quaternary compounds may be present in the particles at a uniform concentration, or may be present in the same particles at partially different concentrations.

For example, the quantum dots may have a core-shell structure including a core comprising the nanocrystals and a shell surrounding the core. The shells of the quantum dots may serve as a protective layer for maintaining the semiconductor properties by preventing chemical denaturation of the core and as a charging layer for imparting electrophoretic properties to the quantum dots. The shell may be either a single layer or multiple layers. At the interface between the core and the shell, the gradient of the concentrate of atoms in the shell may decrease toward the center. The shell of the quantum dot may be made of an oxide of a metal or a non-metal, a semiconductor compound, a combination thereof, etc.

For example, examples of the metal or non-metal oxide may include, but are not limited to, binary compounds such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$ and NiO or ternary compounds such as $MgAl_2O_4$, $CoFe_2O_4$, $NiFe_2O_4$ and $CoMn_2O_4$.

Examples of the semiconductor compound may include, but are not limited to, CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, etc.

The light output from the first wavelength shifters WLS1 may have a full width of half maximum (FWHM) of the emission wavelength spectrum of about 45 nm or less, about 40 nm or less, or about 30 nm or less. In this manner, the color purity and color gamut of the colors displayed by the display device 10 can be further improved. The light output from the first wavelength shifts WLS1 may travel in different directions regardless of the incidence direction of the incident light. Accordingly, the side visibility of the red color displayed in the first light-emitting area TA1 can be improved.

A part of the blue light emitted from the light emitting element layer EML may pass through the first wavelength-converting unit WLC1 without being converted into red light by the first wavelength shifters WLS1. In case that such blue light may be incident on the first color filter CF1, it can be blocked by the first color filter CF1. On the other hand, red light converted by the first wavelength-converting unit WLC1 may pass through the first color filter CF1 to exit to the outside. Accordingly, the first light-emitting area LA1 may emit red light.

The second wavelength converting unit WLC2 may be disposed in the second light-emitting area LA2 on the first capping layer CAP1. The second wavelength converting unit WLC2 may be surrounded by the first light-blocking member BK1. The second wavelength-converting unit WLC2 may include a second base resin BS2, second scatterers SCT2, and second wavelength shifters WLS2.

The second base resin BS2 may include a material having a relatively high light transmittance. The second base resin BS2 may be made of a transparent organic material. For example, the second base resin BS2 may be made of the same material as the first base resin BS1 or may be made of one of the above-listed materials of the first base resin BS1.

The second scatterers SCT2 may have a refractive index different from that of the second base resin BS2 and may form an optical interface with the second base resin BS2. For example, the second scatterers SCT2 may include a light scattering material or light scattering particles that scatter at least a part of transmitted light. For example, the second scatterers SCT2 may be made of the same material as the first scatterers SCT1 or may be made of one of the above-listed materials of the first scatterers SCT1. The second scatters SCT2 may scatter light in random directions irrespective of the incidence direction of the incident light, without substantially changing the peak wavelength of the incident light.

The second wavelength shifters WLS2 may convert or shift the peak wavelength of the incident light to a second peak wavelength that may be different from the first peak wavelength of the first wavelength shifters WLS1. For example, the second wavelength shifters WLS2 may convert blue light provided from the display device 10 into blue light having a single peak wavelength in the range of about 510 nm to about 550 nm, and output the light. The second wavelength shifters WLS2 may be quantum dots, quantum rods, phosphor, or a combination thereof. The second wavelength shifters WLS2 may include the above-listed materials of the first wavelength shifters WLS1. The wavelength conversion range of the second wavelength shifters WLS2 may be formed of quantum dots, quantum rods, phosphor, or a combination thereof, so that it may be different from the wavelength conversion range of the first wavelength shifters WLS1.

The light-transmitting unit LTU may be disposed in the third light-emitting area LA3 on the first capping layer CAP1. The light-transmitting unit LTU may be surrounded by the first light-blocking member BK1. The light-transmitting unit LTU may transmit the incident light without converting its peak wavelength. The light-transmitting unit LTU may include a third base resin BS3 and third scatterers SCT3.

The third base resin BS3 may include a material having a relatively high light transmittance. The third base resin BS3 may be made of a transparent organic material. For example, the third base resin BS3 may be made of the same material as the first base resin BS1 or the second resin BS2 or may be made of one of the above-listed materials of the first base resin BS1 or the second base resin BS2.

The third scatterers SCT3 may have a refractive index different from that of the third base resin BS3 and may form an optical interface with the third base resin BS3. For example, the third scatterers SCT3 may include a light scattering material or light scattering particles that scatter at least a part of transmitted light. For example, the third scatterers SCT3 may be made of the same material as the first scatterers SCT1 or the second scatterers SCT2, or may be made of one of the above-listed materials of the first scatterers SCT1 or the second scatterers SCT2. The third scatters SCT3 may scatter light in random directions irrespective of the incidence direction of the incident light, without substantially changing the peak wavelength of the incident light.

The first and second wavelength converting units WLC1 and WLC2 and the light-transmitting unit LTU may be disposed on the light emitting element layer EML through the second planarization layer OC2 and the first capping layer CAP1. Therefore, the display device 10 may not require a separate substrate for the first and second wavelength converting units WLC1 and WLC2 and the light-transmitting unit LTU. Therefore, the first and second wavelength converting units WLC1 and WLC2 and the light-transmitting unit LTU can be easily aligned with the first to third light-emitting areas LA1, LA2 and LA3, respectively, so that the thickness of the display device 10 can be reduced relatively.

The second capping layer CAP2 may cover the first and second wavelength converting units WLC1 and WLC2, the light-transmitting unit LTU, and the first light-blocking member BK1. For example, the second capping layer CAP2 may seal the first and second wavelength converting units WLC1 and WLC2 and the light-transmitting unit LTU to thereby prevent damage or contamination to the first and second wavelength converting units WLC1 and WLC2 and the light-transmitting unit LTU. The second capping layer CAP2 may be made of the same material as the first capping layer CAP1, or may be made of the above-listed materials of the first capping layer CAP1.

The third planarization layer OC3 may be disposed on the second capping layer CAP2 to provide the flat top surfaces of the first and second wavelength converting units WLC1 and WLC2 and the light-transmitting part LTU. The third planarization layer OC3 may include an organic material. For example, the third planarization layer OC3 may be at least one of an acrylic resin, an epoxy resin, a phenol resin, a polyamide resin, and a polyimide resin.

The color filter layer CFL may include a second light-blocking member BK2, the first to third color filters CF1, CF2 and CF3, and the third passivation layer PAS3.

The second light-blocking member BK2 may be disposed in the first to third light-blocking areas BA1, BA2 and BA3 on the third planarization layer OC3 of the wavelength conversion layer WLCL. The second light-blocking member BK2 may overlap the first light-blocking member BK1 or the second bank BNAK2 in the thickness direction. The second light-blocking member BK2 can block the transmission of light. The second light-blocking member BK2 can improve the color gamut by preventing lights from intruding and mixing among the first to third light-emitting areas LA1, LA2 and LA3. The second light-blocking member BK2 may be arranged in a lattice shape surrounding the first to third light emitting regions LA1, LA2, and LA3 when viewed from the top.

The first color filter CF1 may be disposed in the first light-emitting area LA1 on the third planarization layer OC3. The first color filter CF1 may be surrounded by the second light-blocking member BK2. The first color filter CF1 may overlap the first wavelength-converting unit WLC1 in the thickness direction. The first color filter CF1 may selectively transmit light of the first color (e.g., red light) and may block and absorb light of the second color (e.g., green light) and light of the third color (e.g., blue light). For example, the first color filter CF1 may be a red color filter and may include a red colorant. The red colorant may be made of a red dye or a red pigment.

The second color filter CF2 may be disposed in the second light-emitting area LA2 on the third planarization layer OC3. The second color filter CF2 may be surrounded by the second light-blocking member BK2. The second color filter CF2 may overlap the second wavelength converting unit WLC2 in the thickness direction. The second color filter CF2 may selectively transmit light of the second color (e.g., green light) and may block and absorb light of the first color (e.g., red light) and light of the third color (e.g., blue light). For example, the second color filter CF2 may be a green color filter and may include a green colorant. The green colorant may be made of a green dye or a green pigment.

The third color filter CF3 may be disposed in the third light-emitting area LA3 on the third planarization layer OC3. The third color filter CF3 may be surrounded by the second light-blocking member BK2. The third color filter CF3 may overlap the light-transmitting unit LTU in the thickness direction. The third color filter CF3 may selectively transmit light of the third color (e.g., blue light) and may block and absorb light of the first color (e.g., red light) and light of the second color (e.g., green light). For example, the third color filter CF3 may be a blue color filter and may include a blue colorant. The blue colorant may be made of a blue dye or a blue pigment.

The first to third color filters CF1, CF2 and CF3 may absorb a part of the light introduced from the outside of the display device 10 to reduce reflection of external light. Accordingly, the first to third color filters CF1, CF2 and CF3 can prevent color distortion due to reflection of external light.

The first to third color filters CF1, CF2 and CF3 may be disposed on the first and second wavelength converting units WLC1 and WLC2 and the light-transmitting unit LTU through the third planarization layer OC3, and thus the display device 10 may not require a separate substrate for the first to third color filters CF1, CF2 and CF3. Therefore, the thickness of the display device 10 can be relatively reduced.

The third passivation layer PAS3 may cover the first to third color filters CF1, CF2, and CF3. The third passivation layer PAS3 can protect the first to third color filters CF1, CF2 and CF3.

The encapsulation layer ENC may be disposed on the third passivation layer PAS3 of the color filter layer CFL. For example, the encapsulation layer ENC may include at least one inorganic layer to prevent permeation of oxygen or moisture. The encapsulation layer ENC may include at least one organic layer to protect the display device 10 from foreign substances such as dust.

Figure 4:
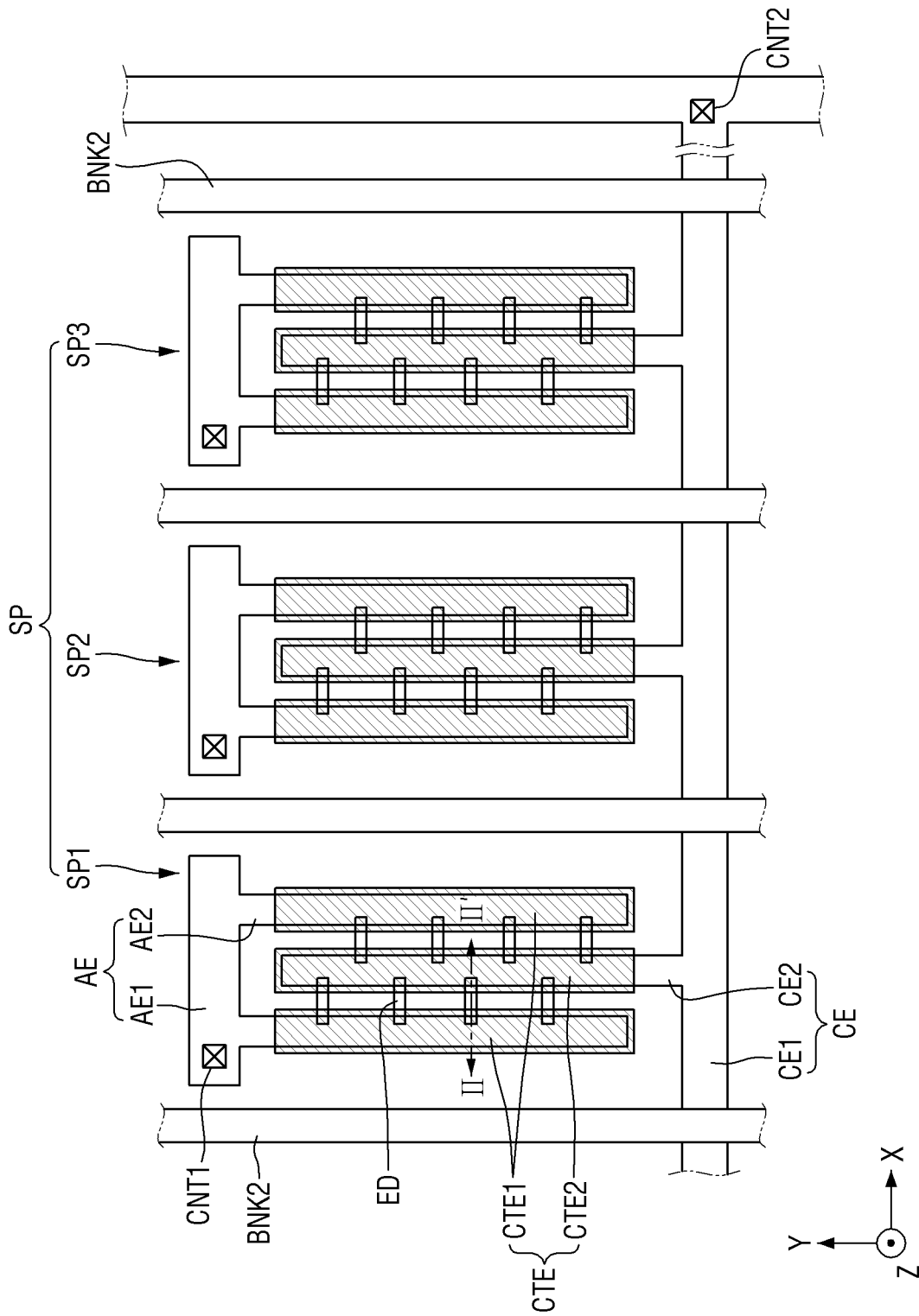
FIG. 4 is a schematic plan view showing a pixel of a display device according to an embodiment of the disclosure.

FIG. 4 is a schematic plan view showing a pixel of a display device according to an embodiment of the disclosure.

Referring to FIG. 4, each of the pixels SP may include first to third sub-pixels SP1, SP2 and SP3. The first to third sub-pixels SP1, SP2 and SP3 may correspond to the first to third light-emitting areas LA1, LA2 and LA3, respectively. The light-emitting diodes ED of each of the first to third sub-pixels SP1, SP2 and SP3 may emit light through the first to third light-emitting areas LA1, LA2 and LA3.

Each of the first to third sub-pixels SP1, SP2, and SP3 may emit light of the same color. For example, each of the first to third sub-pixels SP1, SP2 and SP3 may include the light-emitting diodes ED of the same type, and may emit light of the third color or blue light. As another example, the first sub-pixel SP1 may emit light of the first color or red light, the second sub-pixel SP2 may emit light of the second color or green light, and the third sub-pixel SP3 may emit light of the third color or blue light.

Each of the first to third sub-pixels SP1, SP2 and SP3 may include first and second electrodes AE and CE, light-emitting diodes ED, contact electrodes CTE, and second banks BNK2.

The first and second electrodes AE and CE may be electrically connected to the light-emitting diodes ED to receive a voltage, and the light-emitting diodes ED may emit light of a certain wavelength band. At least a part of the first and second electrodes AE and CE may form an electric field in the pixel SP, and the light-emitting diodes ED may be aligned by the electric field.

For example, the first electrode AE may be a pixel electrode separated for each of the first to third sub-pixels SP1, SP2 and SP3, and the second electrode CE may be a common electrode extended across the first to third sub-pixel SP1, SP2 and SP3. One of the first electrode AE and the second electrode CE may be the anode electrode of the light-emitting diodes ED, while the other may be the cathode electrode of the light-emitting diodes ED.

The first electrode AE may include a first electrode stem AE1 extended in the first direction (X-axis direction), and at least one first electrode branch AE2 branching off from the first electrode stem AE1 and extended in the second direction (Y-axis direction).

The first electrode stem AE1 of each of the first to third sub-pixels SP1, SP2 and SP3 may be spaced apart from the first electrode stem AE1 of an adjacent sub-pixel, and the first electrode stem AE1 may be disposed on an imaginary extension line with the first electrode stem AE1 of the sub-pixel adjacent in the first direction (X-axis direction). The first electrode stems AE1 of the first to third sub-pixels SP1, SP2 and SP3 may receive different signals, respectively, and may be driven individually.

The first electrode branch part AE2 may branch off from the first electrode stem AE1 and may be extended in the second direction (Y-axis direction). An end of the first electrode branch AE2 may be electrically connected to the first electrode stem AE1, while another end of the first electrode branch AE2 may be spaced apart from the second electrode stem CE1 opposed to the first electrode stem AE1.

The second electrode CE may include a second electrode stem CE1 extended in the first direction (X-axis direction), and a second electrode branch CE2 branching off from the second electrode stem CE1 and extended in the second direction (Y-axis direction). The second electrode stem CE1 of each of the first to third sub-pixels SP1, SP2 and SP3 may be electrically connected to the second electrode stem CE1 of an adjacent sub-pixel. The second electrode stem CE1 may be extended in the first direction (X-axis direction) to traverse the sub-pixels SP. The second electrode stem CE1 may be connected to a portion extended in a direction in an outer portion of the display area DA or the non-display area NDA.

The second electrode branch CE2 may be spaced apart from and face the first electrode branch AE2. An end of the second electrode branch CE2 may be electrically connected to the second electrode stem CE1, while another end of the second electrode branch CE2 may be spaced apart from the first electrode stem AE1.

The first electrode AE may be electrically connected to the thin-film transistor layer TFTL of the display device 10 through a first contact hole CNT1, and the second electrode CE may be electrically connected to the thin-film transistor layer TFTL of the display device 10 through a second contact hole CNT2. For example, the first contact hole CNT1 may be formed in each of the first electrode stems AE1, and the second contact hole CNT2 may be formed in the second electrode stem CE1. It is, however, to be understood that the disclosure is not limited thereto.

The second bank BNK2 may be disposed at the boundary between the pixels SP. The first electrode stems AE1 may be spaced apart from one another with respect to the second bank BNK2. The second bank BNK2 may be extended in the second direction (Y-axis direction) and may be disposed at the boundary of the pixels SP arranged in the first direction (X-axis direction). The second bank BNK2 may be disposed at the boundary of the pixels SP arranged in the second direction (Y-axis direction) as well. The second bank BNK2 may define the boundaries between the pixels SP.

In case that an ink in which the light-emitting diodes ED may be dispersed may be sprayed during the process of fabricating the display device 10, the second bank BNK2 can prevent the ink from flowing over the boundaries of the pixels SP. The second bank BNK2 can separate the inks in which different light-emitting diodes ED may be dispersed so that the inks may not be mixed with each other.

The light-emitting diodes ED may be disposed between the first electrode AE and the second electrode CE. An end of the light emitting diode ED may be electrically connected to the first electrode AE, and another end of the light emitting diode ED may be electrically connected to the second electrode CE. For example, the light-emitting diodes ED may be electrically connected to the first electrode AE through a first contact electrode CTE1, and may be electrically connected to the second electrode CE through a second contact electrode CTE2.

The light-emitting diodes ED may be spaced apart from one another and may be substantially aligned in parallel with one another. The spacing between the light-emitting diodes ED is not particularly limited herein. Some of the light-emitting diodes ED may be disposed adjacent to one another, some others of the light-emitting diodes ED may be spaced apart at a certain spacing, and yet others of the light-emitting diodes ED may be aligned in a specific direction with a non-uniform density. For example, the light-emitting diodes ED may be arranged in the direction perpendicular to the direction in which the first electrode branch AE2 or the second electrode branch CE2 may be extended. As another example, the light-emitting diodes ED may be arranged in a direction oblique to the direction in which the first electrode branch AE2 or the second electrode branch CE2 may be extended.

The light-emitting diodes ED may include active layers having the same material so that they may emit light of the same wavelength range or light of the same color. The first to third sub-pixels SP1, SP2 and SP3 may emit light of the same color. For example, the light-emitting diodes ED may emit light of the third color or blue light having a peak wavelength in the range of about 440 nm to about 480 nm. Therefore, the light emitting element layer EML of the display device 10 may emit light of the third color or blue light. As another example, the first to third sub-pixels SP1, SP2 and SP3 may include the light-emitting diodes ED having different active layers, and may emit lights of different colors.

The contact electrodes CTE may include first and second contact electrodes CTE1 and CTE2. The first contact electrode CTE1 may cover the first electrode branch AE2 and parts of the light-emitting diodes ED, and may electrically connect the first electrode branch AE2 with the light-emitting diodes ED. The second contact electrode CTE2 may cover the second electrode branch CE2 and other parts of the light emitting diodes ED, and may electrically connect the second electrode branch CE2 and the light emitting diodes ED.

The first contact electrode CTE1 may be disposed on the first electrode branch AE2 and extended in the second direction (Y-axis direction). The first contact electrode CTE1 may be in contact with first ends of the light-emitting diodes ED. The light-emitting diodes ED may be electrically connected to the first electrode AE through the first contact electrode CTE .

The second contact electrode CTE2 may be disposed on the second electrode branch CE2 and extended in the second direction (Y-axis direction). The second contact electrode CTE2 may be spaced apart from the first contact electrode CTE1 in the first direction (X-axis direction). The second contact electrode CTE2 may be in contact with second ends of the light-emitting diodes ED. The light-emitting diodes ED may be electrically connected to the second electrode CE through the second contact electrode CTE2.

For example, the widths of the first and second contact electrodes CTE1 and CTE2 may be larger than the widths of the first and second electrode branches AE2 and CE2, respectively. As another example, the first and second contact electrodes CTE1 and CTE2 may cover sides of the first and second electrode branches AE2 and CE2, respectively.

Figure 5:
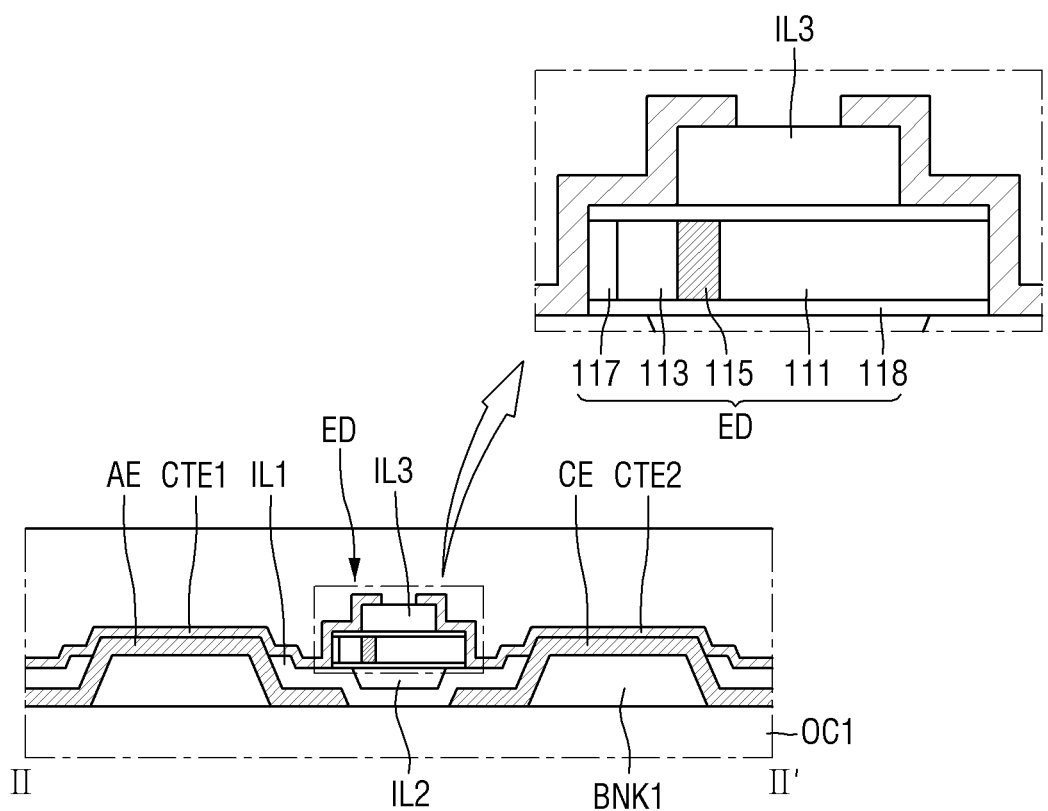
FIG. 5 is a schematic cross-sectional view taken along line II-II' of FIG. 4.

FIG. 5 is a schematic cross-sectional view taken along line II-II' of FIG. 4.

Referring to FIG. 5, the light emitting element layer EML of the display device 10 may be disposed on the thin-film transistor layer TFTL, and may include first to third insulating layers ILL IL2 and IL3.

The first banks BNK1 may be disposed in the first to third light-emitting areas LA1, LA2 and LA3, respectively. Each of the first banks BNK1 may correspond to the first electrode AE or the second electrode CE. Each of the first and second electrodes AE and CE may be disposed on the respective first bank BNK1. For example, each of the first and second electrode branches AE2 and CE2 may be disposed on the respective first bank BNK1. The first banks BNK1 may include, but is not limited to, polyimide (PI).

The first banks BNK1 may be disposed on the first planarization layer OC1, and the side surfaces of each of the first banks BNK1 may be inclined from the first planarization layer OC1. For example, each of the first and second electrodes AE and CE may contain a material having a high reflectivity, and may be disposed on the inclined surfaces of the first banks BNK1 to reflect the light emitted from the light-emitting diodes ED toward the upper side of the display device 10.

Referring to FIG. 5 in conjunction with FIG. 4, the first electrode stem AE1 may include the first contact hole CNT1 penetrating through the first planarization layer OC1. The first electrode stem AE1 may be electrically connected to the thin-film transistor TFT through the first contact hole CNT1. Accordingly, the first electrode AE may receive an electric signal from the thin-film transistor TFT.

The second electrode stem CE1 may be extended in the first direction (X-axis direction) and may be disposed in a non-light-emitting area as well where the light-emitting diodes ED may not be disposed. The second electrode stem CE1 may include the second contact hole CNT2 penetrating through the first planarization layer OC1. The second electrode stem CE1 may be electrically connected to a power electrode through the second contact hole CNT2. The second electrode CE may receive an electric signal from the power electrode.

The first and second electrodes AE and CE may include a transparent conductive material. For example, each of the first and second electrodes AE and CE may include, but is not limited to, at least one of indium tin oxide (ITO), indium zinc oxide (IZO), and indium tin-zinc oxide (ITZO).

The first and second electrodes AE and CE may include a conductive material with high reflectivity. For example, the first and second electrodes AE and CE may include a metal having high reflectivity, such as silver (Ag), copper (Cu), aluminum (Al), or a combination thereof. The first and second electrodes AE and CE can reflect light incident from the light-emitting diodes ED toward the upper side of the display device 10.

The first and second electrodes AE and CE may be made up of a stack of one or more transparent conductive materials and one or more metals having high reflectivity or a single layer including them. For example, the first and second electrodes AE and CE may have a stack structure of ITO/silver(Ag)/ITO/IZO, or may be an alloy including aluminum (Al), nickel (Ni), lanthanum (La), etc. It is, however, to be understood that the disclosure is not limited thereto.

The first insulating layer IL1 may be disposed on the first planarization layer OC1, the first electrode AE, and the second electrode CE. The first insulating layer IL1 may partially cover each of the first and second electrodes AE and CE. For example, the first insulating layer IL1 may expose portions of the first and second electrodes AE and CE corresponding to the upper surfaces of the first banks BNK1, and may cover the other portions of the first and second electrodes AE and CE that do not correspond to the upper surfaces. Accordingly, the first insulating layer IL1 may include openings exposing portions of the first and second electrodes AE and CE corresponding to the upper surfaces of the first banks BNK1.

The first insulating layer IL1 may include an inorganic insulating material, and may include depressed portions between the first and second electrodes AE and CE. The depressed portions of the first insulating layer IL1 may be filled with the second insulating layer IL2. Accordingly, the second insulating layer IL2 can make the upper surface of the first insulating layer IL1 even, and accordingly the light-emitting diodes ED may be disposed on the first and second insulating layers IL1 and IL2.

The first insulating layer IL1 can protect the first and second electrodes AE and CE and may insulate the first and second electrodes AE and CE from each other. The first insulating layer IL1 can prevent that the light-emitting diodes ED may be in direct contact with other elements and damaged by them.

The light-emitting diodes ED may be disposed between the first electrode AE and the second electrode CE on the first and second insulating layers IL1 and IL2. An end of the light emitting diode ED may be electrically connected to the first electrode AE, and another end of the light emitting diode ED may be electrically connected to the second electrode CE. For example, the light-emitting diodes ED may be electrically connected to the first electrode AE through a first contact electrode CTE1, and may be electrically connected to the second electrode CE through a second contact electrode CTE2.

The third insulating layer IL3 may be partially disposed on the light-emitting diodes ED disposed between the first electrode AE and the second electrode CE. The third insulating layer IL3 may partially cover the outer surface of the light-emitting diodes ED. The insulating layer IL3 can protect the light-emitting diodes ED.

The contact electrodes CTE may include first and second contact electrodes CTE1 and CTE2. The first contact electrode CTE1 may cover the first electrode branch AE2 and parts of the light-emitting diodes ED, and may electrically connect the first electrode branch AE2 with the light-emitting diodes ED. The second contact electrode CTE2 may cover the second electrode branch CE2 and other parts of the light emitting diodes ED, and may electrically connect the second electrode branch CE2 and the light emitting diodes ED.

The first contact electrode CTE1 may be disposed on the first electrode branch AE2 and extend in the second direction (Y-axis direction). The first contact electrode CTE1 may be in contact with first ends of the light-emitting diodes ED. The light-emitting diodes ED may be electrically connected to the first electrode AE through the first contact electrode CTE1.

The second contact electrode CTE2 may be disposed on the second electrode branch CE2 and extend in the second direction (Y-axis direction). The second contact electrode CTE2 may be spaced apart from the first contact electrode CTE1 in the first direction (X-axis direction). The second contact electrode CTE2 may be in contact with second ends of the light-emitting diodes ED. The light-emitting diodes ED may be electrically connected to the second electrode CE through the second contact electrode CTE2.

The contact electrodes CTE may include a conductive material. For example, the contact electrodes CTE may include, but are not limited to, ITO, IZO, ITZO, aluminum (Al), etc., or a combination thereof.

Figure 6:
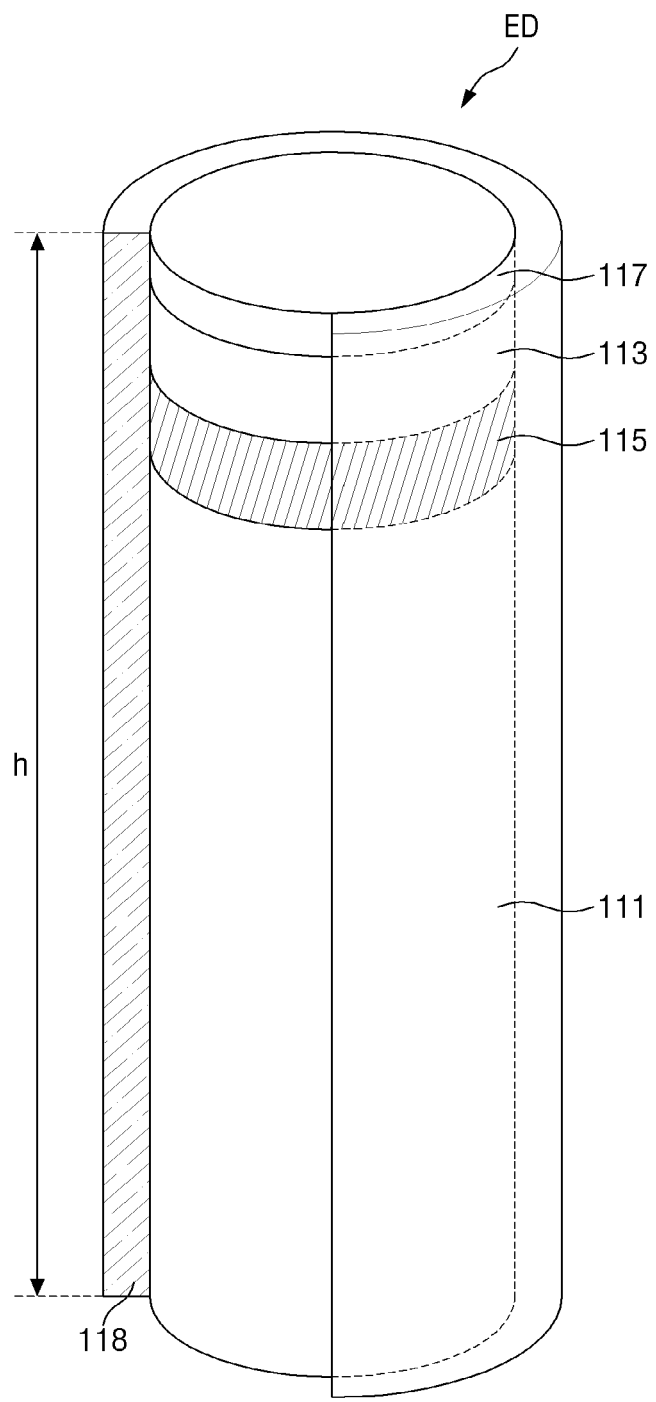
FIG. 6 is a schematic view showing a light-emitting element according to an embodiment of the disclosure.

FIG. 6 is a schematic view showing a light-emitting element according to an embodiment of the disclosure.

Referring to FIG. 6, the light-emitting diode ED may be a light-emitting diode. For example, the light-emitting diodes ED may have a size of a micro-meter or a nano-meter, and may be an inorganic light-emitting diode containing an inorganic material. Inorganic light-emitting diodes may be aligned between two electrodes facing each other as polarities may be created by forming an electric field in a particular direction between the two electrodes.

The light-emitting diode ED may have a shape extended in one direction. The light-emitting diode ED may have a shape of a rod, wire, tube, etc. For example, the light-emitting diode ED may have a cylindrical or rod-like shape. As another example, the light-emitting diode ED may have a variety of shapes including a polygonal column shape such as a cube, a cuboid and a hexagonal column, or a shape that may be extended in a direction with partially inclined portions. The semiconductors included in the light-emitting diode ED may have a structure sequentially arranged or stacked along a direction.

The light-emitting diode ED may include a first semiconductor layer 111, a second semiconductor layer 113, an active layer 115, an electrode layer 117, and an insulating layer 118.

The first semiconductor layer 111 may be an n-type semiconductor. For example, in case that the light-emitting diode ED emits blue light, the first semiconductor layer 111 may include a semiconductor material having the following chemical formula: $Al_xGa_yIn_{1-x-y}N$ ($0 \leq x \leq 1$, $0 \leq y \leq 1$, $0 \leq x+y \leq 1$). The first semiconductor layer 111 may be at least one semiconductor material among n-type doped AlGaInN, GaN, AlGaN, InGaN, AlN and InN. The first semiconductor layer 111 may be doped with an n-type dopant such as Si, Ge and Sn. The first semiconductor layer 111 may be n-GaN doped with n-type Si. The length of the first semiconductor layer 111 may range, but is not limited to, from about 1.5 μm to about 5 μm.

The second semiconductor layer 113 may be disposed on the active layer 115. For example, in case that the light-emitting diode ED emits blue light or green light, the second semiconductor layer 113 may include a semiconductor material having the following chemical formula: $Al_xGa_yIn_{1-x-y}N$ ($0 \leq x \leq 2$, $0 \leq y \leq 1$, $0 \leq x+y \leq 1$). For example, the second semiconductor layer 113 may be at least one semiconductor material among p-type doped AlGaInN, GaN, AlGaN, InGaN, AlN and InN. The second semiconductor layer 113 may be doped with a p-type dopant such as Mg, Zn, Ca, Se and Ba. The second semiconductor layer 113 may be p-GaN doped with p-type Mg. The length of the second semiconductor layer 113 may range, but is not limited to, from about 0.05 μm to about 0.10 μm.

Each of the first and second semiconductor layers 111 and 113 may be made up of, but are not limited to, a single layer. For example, each of the first and second semiconductor layers 111 and 113 may have multiple layers including a clad layer or a tensile strain barrier reducing (TSBR) layer.

The active layer 115 may be disposed between the first and second semiconductor layers 111 and 113. The active layer 115 may include a material having a single or multiple quantum well structure. In case that the active layer 115 includes a material having the multiple quantum well structure, quantum layers and well layers may be alternately stacked on one another. The active layer 115 may emit light as electron-hole pairs may be combined therein in response to an electrical signal applied through the first semiconductor layer 111 and the second semiconductor layer 113. For example, in case that the active layer 115 emits blue light, it may include a material such as AlGaN, AlGaInN, or a combination thereof. In case that the active layer 115 has a multi-quantum well structure in which quantum layers and well layers may be alternately stacked on one another, the quantum layers may include AlGaN, AlGaInN, etc., or a combination thereof, and the well layers may include GaN, AlInN, etc., or a combination thereof. The active layer 115 may include AlGaInN as a quantum layer and AlInN as a well layer to emit blue light.

In another embodiment, the active layer 115 may have a structure in which a semiconductor material having a large band gap energy and a semiconductor material having a small band gap energy may be alternately stacked on one another, and may include Group III to Group V semiconductor materials depending on the wavelength range of the emitted light. The light emitted from the active layer 115 is not limited to the blue light. The active layer 115 may emit light of red or green in some implementations. The length of the active layer 115 may range, but is not limited to, from about 0.05 µm to about 0.10 µm.

The light emitted from the active layer 115 may exit in the longitudinal direction of the light-emitting diodes ED as well as through both side surfaces. The directivity of light emitted from the active layer 115 may not be limited.

The electrode layer 117 may be an ohmic contact electrode. As another example, the electrode layer 117 may be a Schottky contact electrode. The light-emitting diode ED may include at least one electrode layer 117. The electrode layer 117 can reduce the resistance between the light-emitting diode ED and the electrode or the contact electrodes CTE in case that the light-emitting diode ED may be electrically connected to the electrode or the contact electrodes CTE. The electrode layer 117 may include a metal having conductivity. For example, the electrode layer 117 may include at least one of aluminum (Al), titanium (Ti), indium (In), gold (Au), silver (Ag), indium tin oxide (ITO), indium zinc oxide (IZO) and indium tin-zinc oxide (ITZO). The electrode layer 117 may include a semiconductor material doped with n-type or p-type impurities.

The insulating layer 118 may surround the outer surfaces of the semiconductor layers and electrode layers. The insulating layer 118 may surround the outer surface of the active layer 115, and may be extended in the direction in which the light-emitting diode ED may be extended. The insulating layer 118 can protect the light-emitting diode ED. For example, the insulating layer 118 may surround the side surface of the light-emitting diode ED and may expose both ends of the light-emitting diode ED in the longitudinal direction.

The insulating layer 118 may include materials having an insulating property such as silicon oxide (SiOx), silicon nitride (SiNx), silicon oxynitride (SiOxNy), aluminum nitride (AlN), aluminum oxide ($Al_2O_3$), or a combination thereof. Accordingly, the insulating layer 118 can prevent an electrical short-circuit that may occur in case that the active layer 115 comes in contact with an electrode through which an electric signal may be transmitted to the light-emitting diode ED. Since the insulating layer 118 may protect the outer surface of the light-emitting diode ED, including the active layer 115, it may be possible to prevent a decrease in luminous efficiency.

The outer surface of the insulating layer 118 may be subjected to surface treatment. The light-emitting diodes ED may be dispersed in an ink and the ink may be sprayed onto the electrode so that third light-emitting diodes ED may be aligned during the process of fabricating the display device 10. Surface treatment may be applied to the insulating layer 118 so that it becomes hydrophobic or hydrophilic, and thus the light-emitting diodes ED can be dispersed in the ink without being aggregated with one another.

Figure 7:
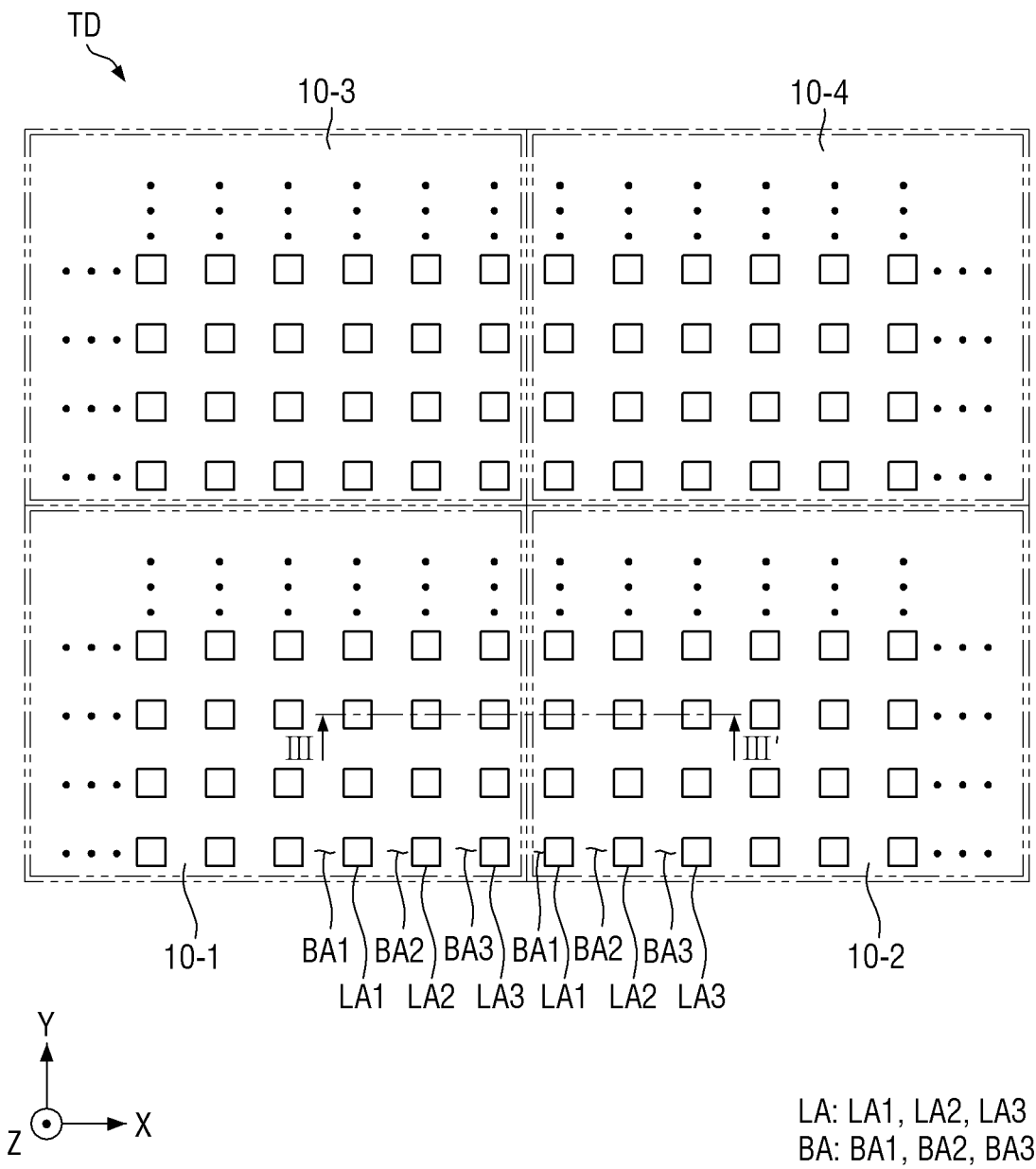
FIG. 7 is a schematic plan view showing a coupling structure of a tiled display according to an embodiment of the disclosure.
Figure 8:
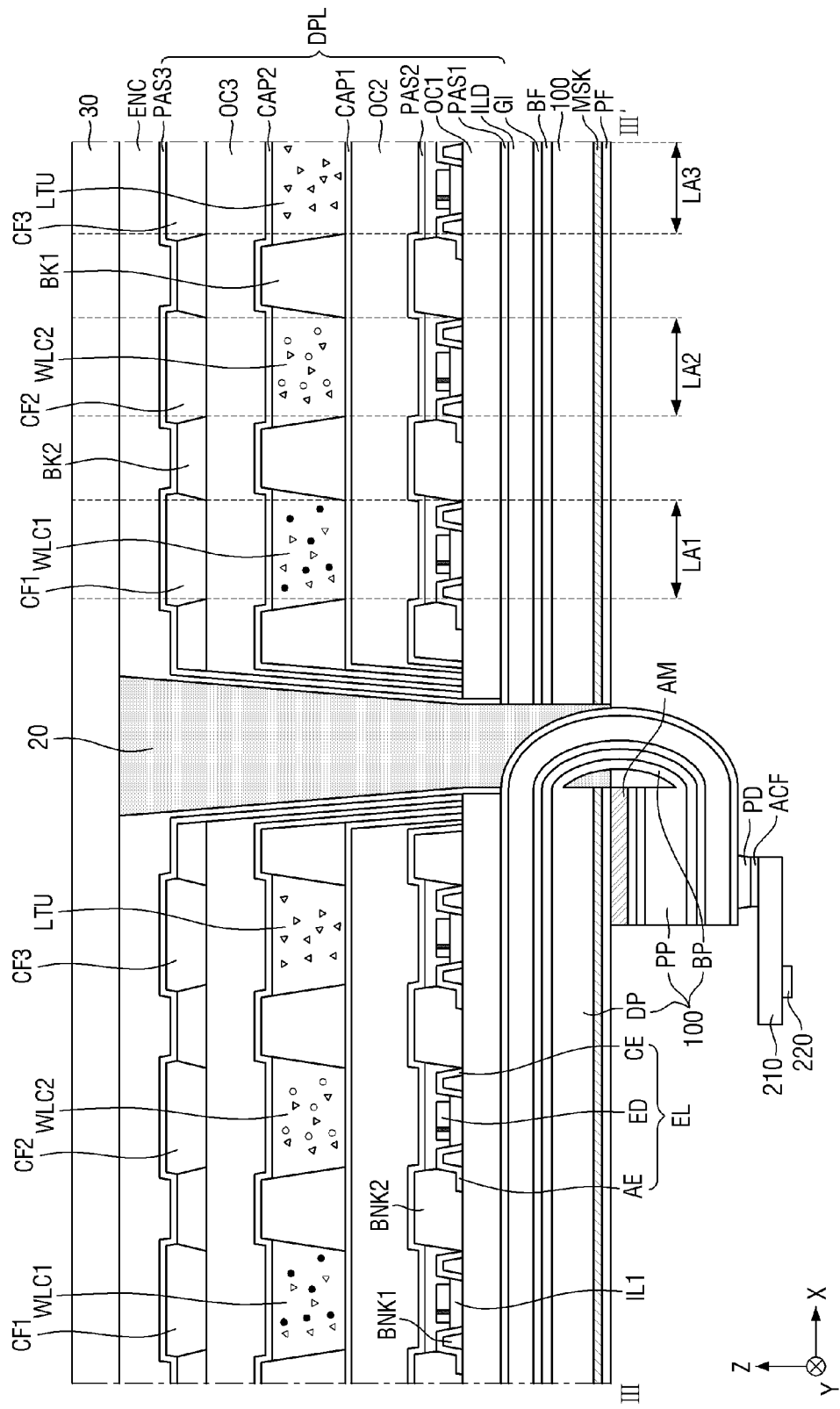
FIG. 8 is a schematic cross-sectional view, taken along line III-III' of FIG. 7.

FIG. 7 is a schematic plan view showing a coupling structure of a tiled display according to an embodiment of the disclosure. FIG. 8 is a schematic cross-sectional view, taken along line III-III' of FIG. 7. In the following description, the same elements as those described above will be briefly described or omitted.

Referring to FIGS. 7 and 8, the tiled display TD may include multiple display devices 10, a coupling member 20, and a cover member 30. For example, the tiled display TD may include first to fourth display devices 10-1 to 10-4 according to an embodiment of FIG. 7, but the number of display devices 10 is not limited to four. The number of display devices 10 may be determined depending on the sizes of the display devices 10 and the tiled display TD.

Each of the first and second display devices 10 may include a substrate 100, a buffer layer BF, a display layer DPL, an encapsulation layer ENC, a metal layer MSK, a protective film PF, a pad electrode PD, a connection film ACF, a flexible film 210, and a source driver 220.

The substrate 100 may be a base substrate or a base member and may be made of an insulating material such as a polymer resin. For example, the substrate 100 may be a flexible substrate that can be bent, folded, or rolled. The substrate 100 may include, but is not limited to, polyimide (PI).

The substrate 100 may include a display part DP, a bending part BP, and a pad part PP.

The display part DP may correspond to the display area DA of the display device 10. The thin-film transistor layer TFTL, the light emitting element layer EML, the wavelength conversion layer WLCL, the color filter layer CFL, and the encapsulation layer ENC of the display device 10 may be stacked on the display part DP sequentially. Accordingly, the display part DP may support the display layer DPL of the display device 10.

The bending part BP may be extended from one side of the display part DP. The bending part BP may be disposed between the display part DP and the pad part PP. The thickness of the bending part BP may be smaller than the thickness of the display part DP or the thickness of the pad part PP. The lower end of the bending part BP may be depressed from the lower end of the display part DP or the lower end of the pad part PP. The lower end of the bending part BP may have a level difference from the lower end of the display part DP or the lower end of the pad part PP. The display devices 10 may include the bending part BP having a thickness smaller than that of the display part DP or the pad part PP, thereby reducing bending stress of the bending part BP. Each of the display devices 10 may include the bending part BP that may be depressed from the display part DP or the pad part PP, thereby reducing the distance between the display devices 10. As a result, it may be possible to prevent the non-display areas or the boundaries between the display devices 10 from being perceived.

The bending part BP may be formed by removing the lower portion of the substrate 100 between the display part DP and the pad part PP. For example, the bending part BP may be formed by removing the lower portion of the substrate 100 through a dry etching process. It is, however, to be understood that the disclosure is not limited thereto. By using the dry etching process, it may be possible to form the bending part BP precisely without removing a part of the display part DP and the pad part PP. The bending part BP may be etched using a process gas and a high-frequency power supply that meet the etching characteristics of the substrate 100. The bending part BP may be etched through physical or chemical reaction between electrons or ions generated in the plasma state of the process gas and the substrate 100.

The shape and area of the bending part BP when viewed from the top may be determined by the metal layer MSK. During the process of forming the bending part BP, the metal layer MSK may be used as a mask. Accordingly, the metal layer MSK may work as a mask for determining the shape and area of the bending part BP when viewed from the top.

The buffer layer BF, the gate insulator GI, the interlayer dielectric layer ILD and the first passivation layer PAS1 may be sequentially stacked on the bending part BP. The bending part BP may support a connection line (not shown) connecting the pad electrode PD disposed on the pad part PP with the thin-film transistor TFT disposed on the display part DP.

The connection line may be disposed on the gate insulator GI or the interlayer dielectric layer ILD. For example, the connection line may be disposed on the same layer as the gate electrode GE, the source electrode SE, or the drain electrode DE of the thin-film transistor TFT. The connection line may be electrically connected to data lines to supply a data voltage, and may be electrically connected to scan lines to supply a scan signal. For example, the connection line CWL may be formed on the same layer and made of the same material as the source electrode SE or the drain electrode DE of the thin-film transistor TFT. Accordingly, the connection line may connect the pad electrode PD with the gate electrode GE, the source electrode SE or the drain electrode DE of the thin-film transistor TFT.

The pad part PP may be disposed at the edge of the substrate 100. The pad part PP may overlap the display part DP in the thickness direction or the Z-axis direction as the bending part BP may be bent. The buffer layer BF, the gate insulator GI, the interlayer dielectric layer ILD and the first passivation layer PAS1 may be sequentially stacked on the pad part PP. The pad part PP may support the pad electrode PD disposed on the first passivation layer PAS1. The connection line passing through the bending part BP may be extended to the pad part PP and may be electrically connected to the pad electrode PD through a contact hole.

The metal layer MSK may be disposed on the lower surface of the substrate 100. The metal layer MSK may be disposed on the other surface of the display part DP that may be opposite to the surface on which the display layer DPL may be disposed. The metal layer MSK may be disposed on another surface of the pad part PP that may be opposite to the surface on which the pad electrode PD may be disposed. The metal layer MSK may be disposed on the lower surface of the display part DP and the lower surface of the pad part PP before the bending part BP may be formed.

The metal layer MSK may include a metal oxide that may be resistant to dry etching. The etch rate of the metal layer MSK may be lower than the etch rate of the substrate 100. Since the metal layer MSK may be resistant to dry etching, it can work as a mask during the process of forming the bending part BP. The metal layer MSK may determine the position, planar shape and size of the bending part BP. The metal layer MSK may determine a region to be etched during the process of etching the lower portion of the substrate 100. For example, the metal layer MSK may be used as a mask for etching the lower portion of the substrate 100 during a dry etching process. The metal layer MSK may be formed of, but is not limited to, a metal thin film including aluminum (Al), copper (Cu), nickel (Ni), ferrite, silver (Ag), or a combination thereof.

The metal layer MSK may release heat generated inside the display device 10 to the outside. A thermal conductivity of the metal layer MSK may be higher than that of the substrate 100. The metal layer MSK may release heat to the outside of the display device 10 in case that heat generated in the thin-film transistor layer TFTL or the light emitting element layer EML may be transferred through the substrate 100.

Therefore, since the display device 10 may include the metal layer MSK, it may be possible to form the bending part BP without using a separate mask, so that the processing steps and the process time can be reduced. The display device 10 may include no separate heat dissipation layer, so that the thickness of the display device 10 can be reduced and the fabricating cost can be saved. Since the display device 10 may include the metal layer MSK, the thickness of the display device 10 can be reduced compared to a display device including a separate heat dissipation layer, thereby preventing layer separation in case that the bending part BP may be bent.

The protective film PF may be disposed on the metal layer MSK. The protective film PF may be disposed on the metal layer MSK covering the display part DP and the metal layer MSK covering the pad part PP. A part of the protective film PF covering the metal layer MSK corresponding to the display part DP and the other part of the protective film PF covering the metal layer MSK corresponding to the pad part PP may face each other as the bending part BP may be bent. The protective film PF corresponding to the pad part PP may be attached to the lower surface of the protective film PF corresponding to the display part DP by an adhesive member AM. The protective film PF corresponding to the pad part PP may be attached to the lower surface of the protective film PF corresponding to the display part DP so that it can be fixed and supported. The protective film PF can protect the metal layer MSK and the substrate 100 overlapping in the thickness direction or the Z-axis direction as the bending part BP may be bent.

The pad electrode PD may be disposed on the pad part PP. The buffer layer BF, the gate insulator GI, the interlayer dielectric layer ILD, the first passivation layer PAS1 and the pad electrode PD may be sequentially stacked on the pad part PP. The pad electrode PD may be exposed on the first passivation layer PAS1 and may be electrically connected to a connection line passing through the bending part BP through a contact hole.

The connection film ACF may attach the flexible film 210 to the pad electrode PD. A surface of the connection film ACF may be attached to the pad electrode PD, and the opposite surface of the connection film ACF may be attached to the flexible film 210. For example, the connection film ACF may cover the entire pad electrode PD, but the disclosure is not limited thereto.

The connection film ACF may include an anisotropic conductive film. In case that the connection film ACF includes an anisotropic conductive film, the connection film ACF may have conductivity in a region where the pad electrode PD and the contact pad of the flexible film 210 may be in contact with each other, and may electrically connect the flexible film 210 with the pad electrode PD.

The flexible film 210 may be disposed on the pad part PP. A side of the flexible film 210 may be electrically connected to the pad electrode PD, and another side of the flexible film 210 may be electrically connected to a source circuit board (not shown). The flexible film 210 may transmit a signal from the source driver 220 to the display device 10. For example, the source driver 220 may be an integrated circuit (IC). The source driver 220 may convert digital video data into analog data voltage based on a source control signal from a timing controller, and may supply it to a data line of the display area DA through the flexible film 210.

The coupling member 20 may be disposed between every two of the display devices 10 to couple the side surfaces of the adjacent display devices 10 with each other. The coupling member 20 may connect between the side surfaces of the first to fourth display devices 10-1 to 10-4 arranged in a lattice pattern to implement the tiled display TD. The coupling member 20 may couple the side surfaces of the substrate 100 and the encapsulation layer ENC of each of the display devices 10 with those of adjacent display devices 10. In FIG. 8, the coupling member 20 may couple the side surface of the encapsulation layer ENC, the side surface of the substrate 100, the side surface of the metal layer MSK and the side surface of the protective film PF of the first display device 10-1 with those of the second display device 10-2.

For example, the coupling member 20 may be made of an adhesive or a double-sided tape having a relatively thin thickness, thereby reducing the gap between the multiple display devices 10. As another example, the coupling member 20 may be implemented as a coupling frame having a relatively small thickness, so that the gap between the display devices 10 can be reduced. Accordingly, the tiled display TD can prevent a viewer from recognizing the non-display areas NDA or the boundaries between the multiple display devices 10.

The cover member 30 may be disposed on the upper surface of the multiple display devices 10 and the coupling member 20 to cover the multiple display devices 10 and the coupling member 20. For example, the cover member 30 may be disposed on the upper surface of the encapsulation layer ENC of each of the multiple display devices 10. The cover member 30 can protect the upper surface of the tiled display TD.

Figure 9:
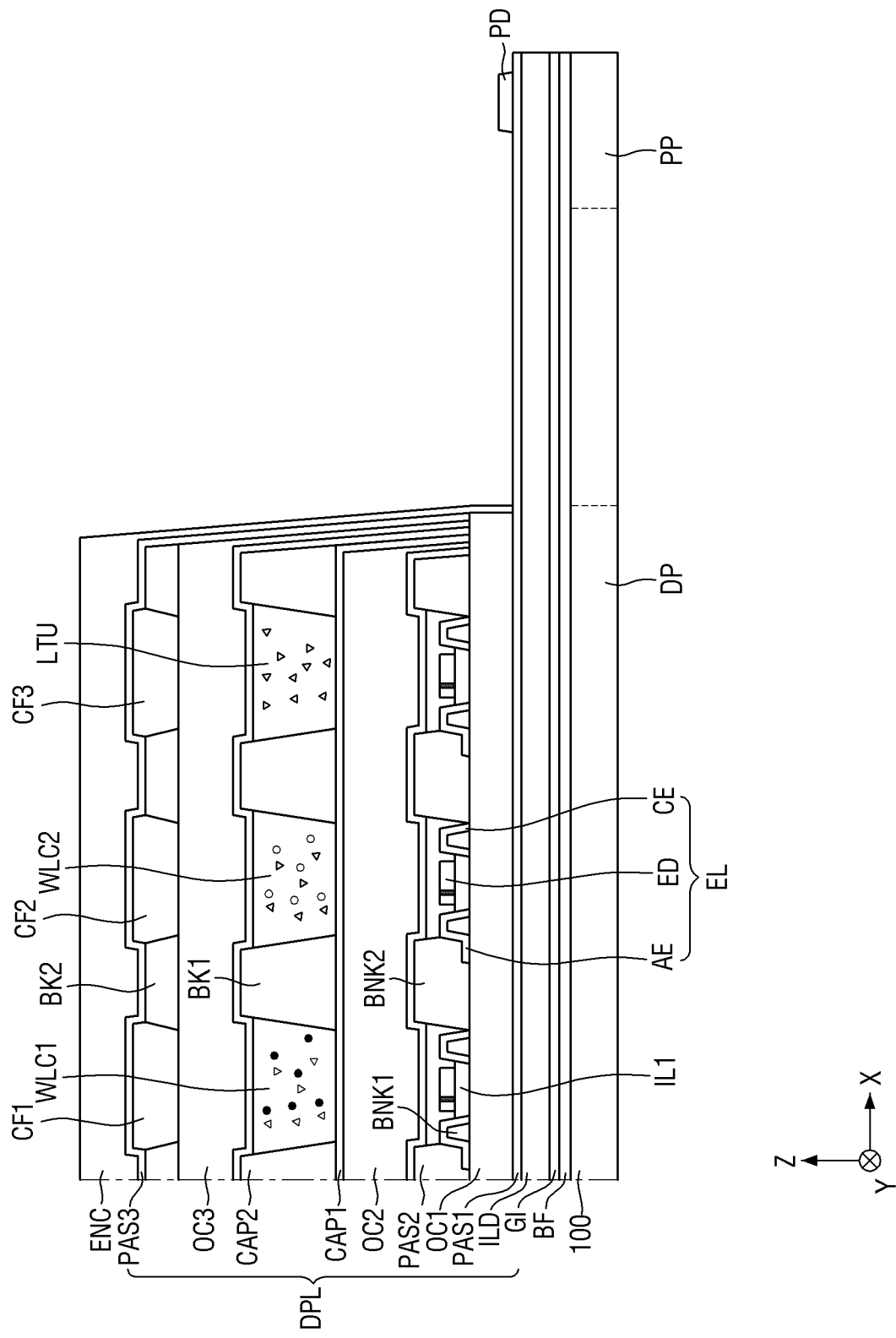
FIG. 9 is a schematic cross-sectional view showing a first processing step during a process of fabricating a display device according to an embodiment of the disclosure.

FIG. 9 is a schematic cross-sectional view showing a first processing step during a process of fabricating a display device according to an embodiment of the disclosure.

Referring to FIG. 9, the substrate 100 may be a base substrate or a base member and may be made of an insulating material such as a polymer resin. For example, the substrate 100 may be a flexible substrate that can be bent, folded, or rolled. The substrate 100 may include, but is not limited to, polyimide (PI). The substrate 100 may include the display part DP and the pad part PP.

The display part DA may correspond to the display area DA of the display device 10. The thin-film transistor layer TFTL, the light emitting element layer EML, the wavelength conversion layer WLCL, the color filter layer CFL, and the encapsulation layer ENC of the display device 10 may be stacked on the display part DP sequentially. Accordingly, the display part DP may support the display layer DPL of the display device 10.

The pad part PP may be disposed at the edge of the substrate 100. The pad part PP may be spaced apart from the display part DP. The buffer layer BF, the gate insulator GI, the interlayer dielectric layer ILD, the first passivation layer PAS1 and the pad electrode PD may be sequentially stacked on the pad part PP. The pad part PP may support the pad electrode PD disposed on the first passivation layer PAS1. The pad part PP may be connected to the thin-film transistor TFT disposed on the display part DP through a connection line.

Figure 10:
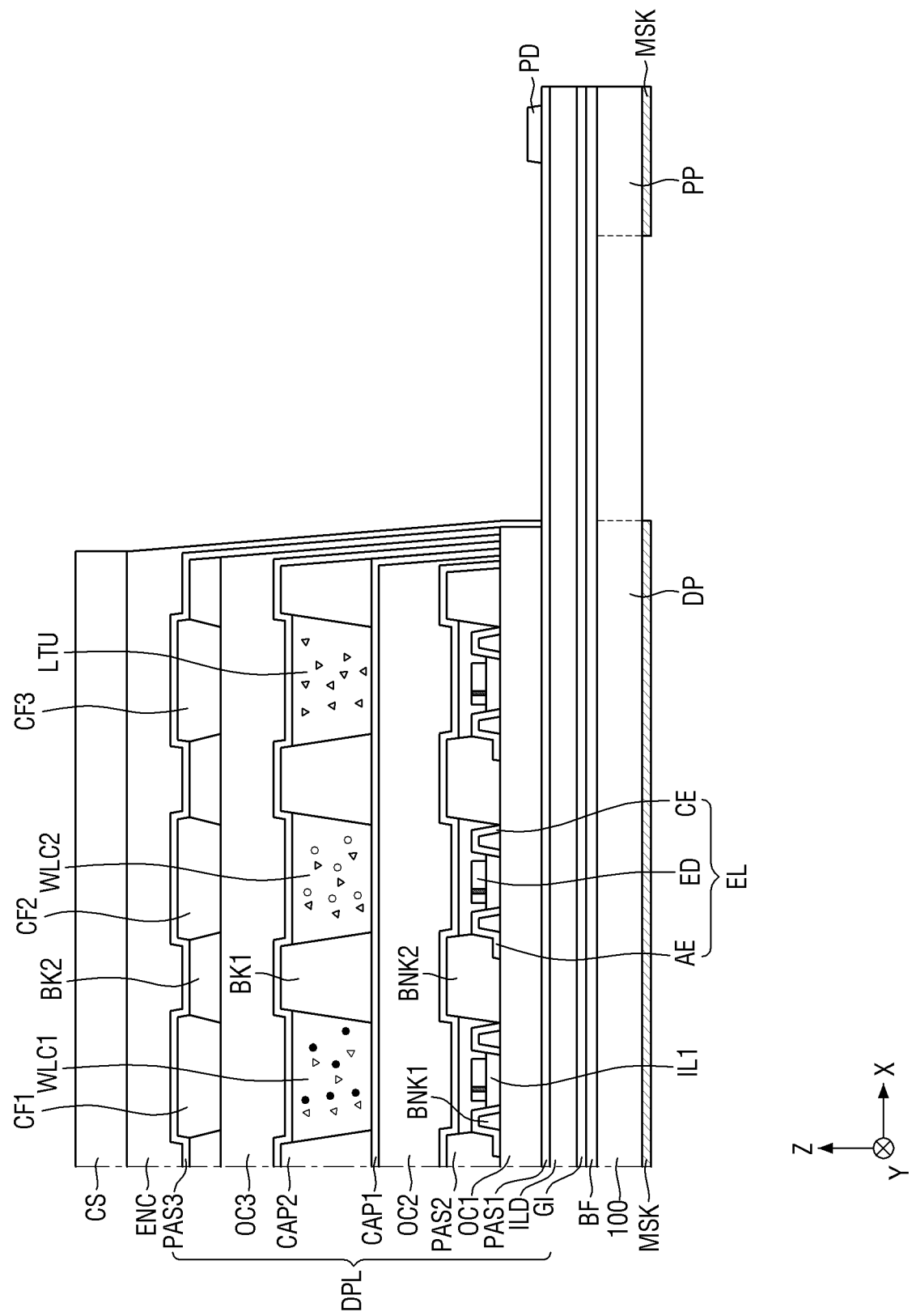
FIG. 10 is a schematic cross-sectional view showing a second processing step during a process of fabricating a display device according to an embodiment of the disclosure.

FIG. 10 is a schematic cross-sectional view showing a second processing step during a process of fabricating a display device according to an embodiment of the disclosure.

Referring to FIG. 10, the encapsulation layer ENC of the display device 10 may be seated on a carrier substrate CS. The carrier substrate CS may temporarily support the display device 10 during a process of etching the substrate 100. In case that the encapsulation layer ENC of the display device 10 may be seated on the carrier substrate CS, the other surface of the substrate 100 that may be opposite to the surface facing the display layer DPL may be exposed.

The metal layer MSK may be disposed on the other surface of the display part DP that may be opposite to the surface facing the display layer DPL, and may be disposed on the other surface of the pad part PP that may be opposite to the surface facing the pad electrode PD. The material forming the metal layer MSK may be applied to the other surface of the substrate 100 and patterned. For example, the material forming the metal layer MSK may be disposed on the other surface of the substrate 100 and may be patterned using a photoresist process.

For example, the material forming the metal layer MSK may be a negative photoresist. The material forming the metal layer MSK may be placed on the entire other surface of the substrate 100, and the mask member may be disposed excluding the position where the metal layer MSK is to be formed. In case that light may be irradiated onto the mask member and the metal layer MSK, regions other than the metal layer MSK may be dissolved, so that the metal layer MSK may be formed.

As another example, the material forming the metal layer MSK may be a positive photoresist. The mask member may be disposed in the position where the metal layer MSK is to be formed. In case that light may be irradiated onto the mask member and the metal layer MSK, regions other than the metal layer MSK may be dissolved, so that the metal layer MSK may be formed.

The metal layer MSK may include a metal oxide that may be resistant to dry etching. The etching rate of the metal layer MSK may be lower than the etching rate of the substrate 100. Since the metal layer MSK may be resistant to dry etching, it can work as a mask during the process of forming the bending part BP. The metal layer MSK may determine the position, planar shape and size of the bending part BP. The metal layer MSK may determine a region to be etched during the process of etching the lower portion of the substrate 100. For example, the metal layer MSK may be used as a mask for etching the lower portion of the substrate 100 during a dry etching process. The metal layer MSK may include, but is not limited to, a metal such as aluminum (Al), copper (Cu), or a combination thereof.

Figure 11:
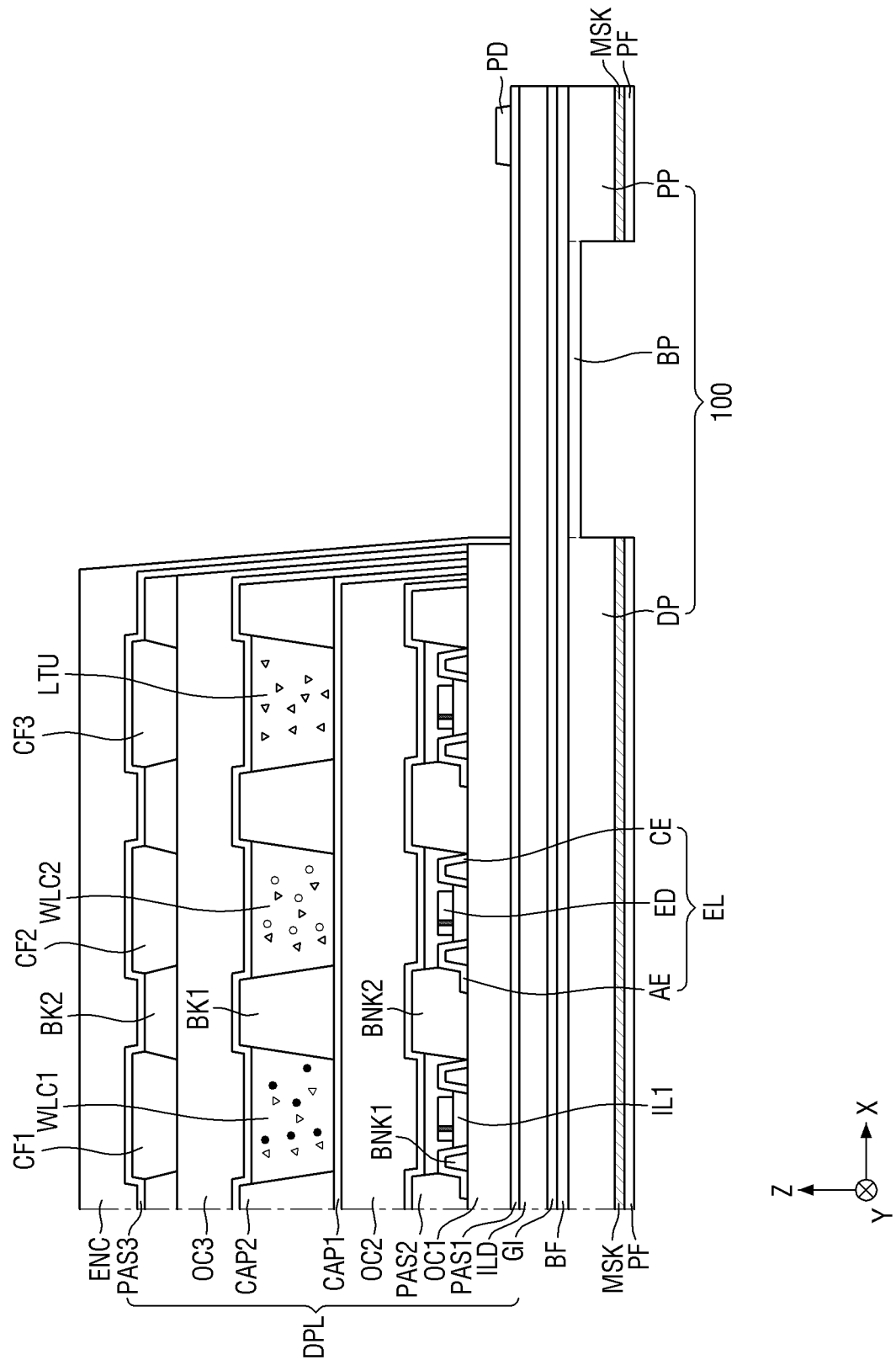
FIG. 11 is a schematic cross-sectional view showing a third processing step during a process of fabricating a display device according to an embodiment of the disclosure.

FIG. 11 is a schematic cross-sectional view showing a third processing step during a process of fabricating a display device according to an embodiment of the disclosure.

Referring to FIG. 11, the bending part BP of the substrate 100 may be formed by removing the lower portion of the substrate 100 between the display part DP and the pad part PP. For example, the bending part BP may be formed by removing the lower portion of the substrate 100 through a dry etching process. It is, however, to be understood that the disclosure is not limited thereto. The thickness of the bending part BP may be smaller than the thickness of the display part DP or the thickness of the pad part PP. The lower end of the bending part BP may be depressed from the lower end of the display part DP or the lower end of the pad part PP.

The shape and area of the bending part BP when viewed from the top may be determined by the metal layer MSK. During the process of forming the bending part BP, the metal layer MSK may be used as a mask. Accordingly, the metal layer MSK may work as a mask for determining the shape and area of the bending part BP when viewed from the top. The carrier substrate CS shown in FIG. 10 may be removed after the bending part BP has been etched.

By using the dry etching process, it may be possible to form the bending part BP precisely without removing a part of the display part DP and the pad part PP. The bending part BP may be etched using a process gas and a high-frequency power supply that meet the etching characteristics of the substrate 100. The bending part BP may be etched through physical or chemical reaction between electrons or ions generated in the plasma state of the process gas and the substrate 100.

The protective film PF may be disposed on the metal layer MSK. The protective film PF may be disposed on the metal layer MSK covering the display part DP and the metal layer MSK covering the pad part PP.

Figure 12:
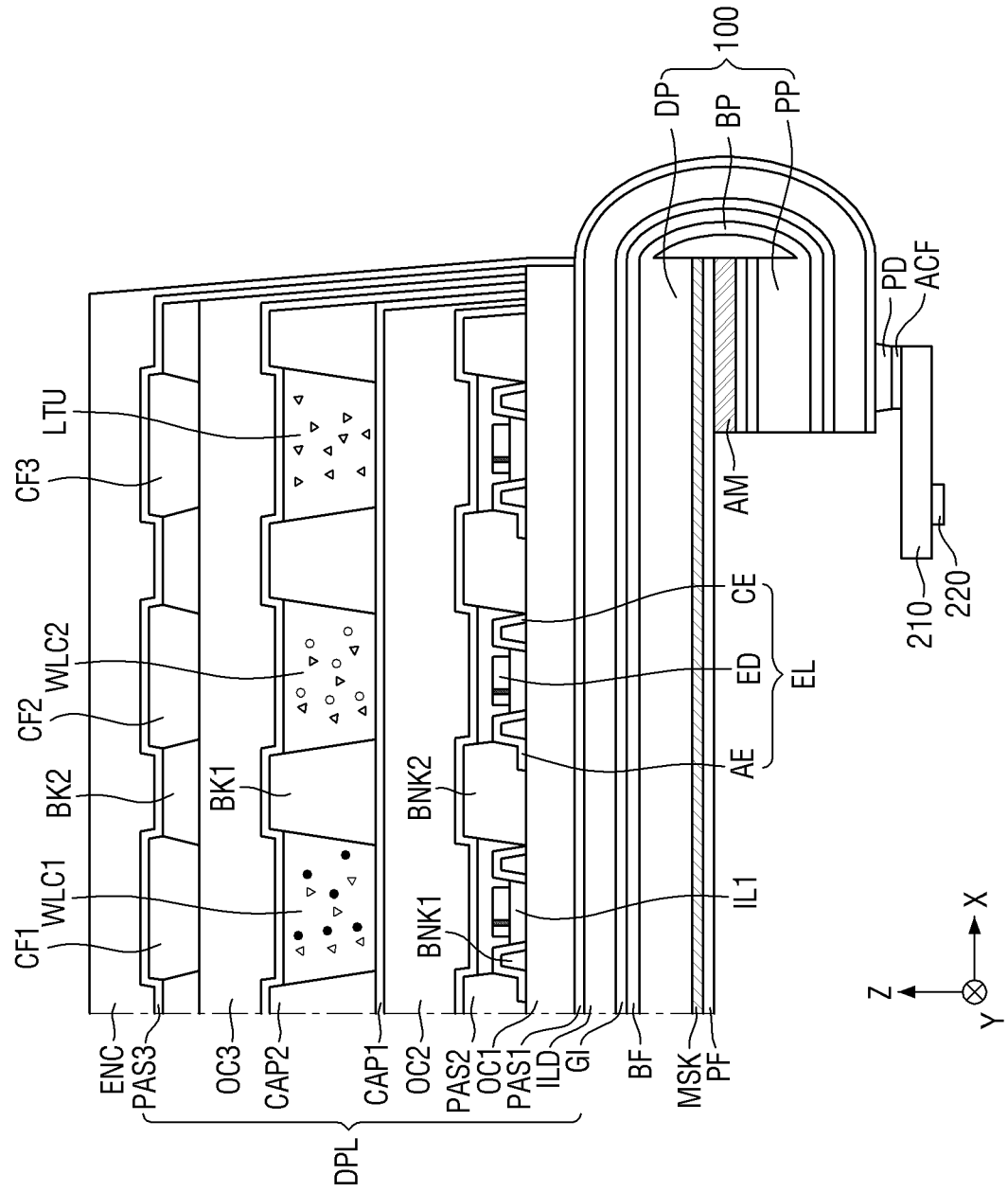
FIG. 12 is a schematic cross-sectional view showing a fourth processing step during a process of fabricating a display device according to an embodiment of the disclosure.

FIG. 12 is a schematic cross-sectional view showing a fourth processing step during a process of fabricating a display device according to an embodiment of the disclosure.

Referring to FIG. 12, the flexible film 210 may be attached to the pad electrode PD by the connection film ACF. A side of the flexible film 210 may be electrically connected to the pad electrode PD, and another side of the flexible film 210 may be electrically connected to a source circuit board. Once the flexible film 210 has been electrically connected, the bending part BP may be bent. The pad part PP may overlap the display part DP in the thickness direction or the Z-axis direction as the bending part BP may be bent.

A part of the protective film PF covering the metal layer MSK corresponding to the display part DP and the other part of the protective film PF covering the metal layer MSK corresponding to the pad part PP may face each other as the bending part BP may be bent. The protective film PF corresponding to the pad part PP may be attached to the lower surface of the protective film PF corresponding to the display part DP by an adhesive member AM. The protective film PF corresponding to the pad part PP may be attached to the lower surface of the protective film PF corresponding to the display part DP so that it can be fixed and supported. The protective film PF can protect the metal layer MSK and the substrate 100 overlapping in the thickness direction or the Z-axis direction as the bending part BP may be bent.

Although embodiments of the invention have been disclosed for illustrative purposes, those skilled in the art will appreciate that various modifications, additions and substitutions are possible, without departing from the scope and spirit of the invention as disclosed in the accompanying claims and their equivalents.

What is claimed is:

1. A display device comprising:
   a substrate comprising a display part, a pad part, and a bending part between the display part and the pad part;
   a display layer disposed on a first surface of the display part, the display layer comprising pixels;
   a pad electrode disposed on a first surface of the pad part; and
   a metal layer disposed on a second surface of the display part and on a second surface of the pad part, the second surface of the display part being opposite to the first surface of the display part, and the second surface of the pad part being opposite to the first surface of the pad part, wherein
   a planar shape of the bending part is determined by the metal layer,
   the substrate is disposed between the display layer and the metal layer in the display part,
   the substrate is a base member comprised of an insulating material selected from polyimide (PD) and polymer resin, and
   a thickness of the substrate in the bending part is smaller than a thickness of the substrate in each of the display part and the pad part.

2. The display device of claim 1, wherein
   the metal layer comprises a metal oxide that is resistant to dry etching, and
   an etch rate of the metal layer is lower than an etch rate of the substrate.

3. The display device of claim 1, wherein a thermal conductivity of the metal layer is higher than a thermal conductivity of the substrate.

4. The display device of claim 1, wherein the pad part overlaps the display part in a thickness direction in case that the bending part is bent.

5. The display device of claim 1, further comprising a protective film covering the metal layer disposed on the second surface of the display part and the metal layer disposed on the second surface of the pad part.

6. The display device of claim 5, wherein a part of the protective film covering the metal layer disposed on the second surface of the display part and another part of the protective film covering the metal layer disposed on the second surface of the pad part face each other in case that the bending part is bent.

7. The display device of claim 1, further comprising:
   a flexible film electrically connected to the pad electrode; and
   a source driver disposed on the flexible film,
   wherein the flexible film and the source driver overlap the display part in a thickness direction in case that the bending part is bent.

8. The display device of claim 1, wherein the display layer comprises:
   a thin-film transistor layer disposed on the display part and comprising at least one thin-film transistor;
   a light emitting element layer disposed on the thin-film transistor layer and comprising a light-emitting element electrically connected to the at least one thin-film transistor;
   a wavelength conversion layer disposed on the light emitting element layer and comprising a wavelength converting unit overlapping the light-emitting element; and
   a color filter layer disposed on the wavelength conversion layer and comprising a color filter overlapping the wavelength converting unit.

9. The display device of claim 1, wherein the metal layer comprises a material selected from aluminum (Al), copper (Cu), nickel (Ni), ferrite, silver (Ag), and a combination thereof.

10. The display device of claim 1, wherein an image produced by the display layer is viewed from the first surface and not the second surface.

* * * * *